United States Patent
Lee et al.

(10) Patent No.: US 7,924,593 B2
(45) Date of Patent: Apr. 12, 2011

(54) INFORMATION STORAGE DEVICES AND METHODS OF OPERATING THE SAME

(75) Inventors: Sung-chul Lee, Osan-si (KR); Sun-ae Seo, Hwaseong-si (KR); Young-jin Cho, Suwon-si (KR); Ung-hwan Pi, Seoul (KR); Ji-young Bae, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 247 days.

(21) Appl. No.: 12/232,660

(22) Filed: Sep. 22, 2008

(65) Prior Publication Data

US 2009/0316475 A1    Dec. 24, 2009

(30) Foreign Application Priority Data

Jun. 24, 2008  (KR) .................. 10-2008-0059771

(51) Int. Cl.
*G11C 16/00* (2006.01)
(52) U.S. Cl. ............... 365/80; 365/87; 365/88; 365/158
(58) Field of Classification Search .................. 365/158, 365/80, 87, 88; 360/72.1, 324.11
See application file for complete search history.

(56) References Cited

U.S. PATENT DOCUMENTS

| | | | |
|---|---|---|---|
| 2008/0094760 A1* | 4/2008 | Lee et al. | 360/324.11 |
| 2008/0138659 A1* | 6/2008 | Lim et al. | 428/810 |
| 2008/0158710 A1* | 7/2008 | Lim | 360/69 |
| 2009/0207718 A1* | 8/2009 | Joe et al. | 369/126 |

* cited by examiner

*Primary Examiner* — Hoai V Ho
(74) *Attorney, Agent, or Firm* — Harness, Dickey & Pierce, P.L.C.

(57) ABSTRACT

Provided are an information storage device and a method of operating the same. The information storage device includes: a magnetic layer having a plurality of magnetic domain regions and a magnetic domain wall interposed between the magnetic domain regions; a first unit disposed on a first region which is one of the plurality of magnetic domain regions for recording information to the first region; a second unit connected to the first unit for inducing a magnetic field so as to record information to the first region.

25 Claims, 18 Drawing Sheets

F1a+(F2aa+F2ab+F2ac+F2ad) = F1'

$F1b+(F2ba+F2bb+F2bc+F2bd) = F2'$

INFORMATION STORAGE DEVICES AND METHODS OF OPERATING THE SAME

PRIORITY STATEMENT

This application claims the benefit of Korean Patent Application No. 10-2008-0059771, filed on Jun. 24, 2008, in the Korean Intellectual Property Office, the disclosure of which is incorporated herein in its entirety by reference.

BACKGROUND

1. Technical Field

The present invention relates to information storage devices, and more particularly, to information storage devices using magnetic domain wall motion and methods of operating the same.

2. Description of the Related Art

Examples of conventional nonvolatile information storage devices in which recorded information is retained even when power is cut-off include hard disk drives (HDDS) and nonvolatile random access memories (RAMs).

Conventional HDDs use a rotating part to store information. However, the rotating part may wear down over time, thereby increasing the likelihood of operational failure and thus reducing reliability.

An example of a conventional non-volatile RAM is a flash memory. Although the flash memory does not use a rotating part, it has relatively slow reading and writing speeds, a relatively short life span, and a relatively small storage capacity when compared to a conventional HDD. Flash memories may also have relatively high manufacturing costs.

Another conventional information storage device uses the principle of magnetic domain wall motion of a magnetic material. In these conventional magnetic information storage devices, a minute magnetic region that constitutes a ferromagnetic substance is referred to as a magnetic domain. A boundary portion between magnetic domains having different magnetization directions is referred to as a magnetic domain wall. The magnetic domains and the magnetic domain walls may be moved by applying current to a magnetic layer.

However, the information storage device using the magnetic domain wall motion is still in an initial stage of development and some problems still need to be resolved before it can be practically used. In particular, an improved information recording method is required to enable practical use of information storage devices using magnetic domain wall motion.

SUMMARY

Example embodiments of the present invention provide information storage devices facilitating recording information and methods of operating the same.

According to an aspect of the present invention, there is provided an information storage device including: a magnetic layer having a plurality of magnetic domain regions and a magnetic domain wall interposed between the magnetic domain regions; a first unit disposed on a first region which is one of the plurality of magnetic domain regions for recording information to the first region; a second unit connected to the first unit for inducing a magnetic field so as to record information to the first region.

Through the second unit, a current may be applied to the first unit and the magnetic field is generated by the current flowing through the second unit.

The first unit may record information by using a spin transfer torque.

The first unit may include: a first pinned layer disposed on one of a lower surface and an upper surface of the first region; and a first separation layer interposed between the first pinned layer and the first region.

The first unit may further include: a second pinned layer having a magnetization direction opposite to that of the first pinned layer, the second pinned layer being disposed on the other one of the lower surface and the upper surface of the first region; and a second separation layer interposed between the second pinned layer and the first region.

The first unit may further include: an electrode layer disposed on the other one of the lower surface and the upper surface of the first region; and a resistive layer having a higher electric resistance than that of the magnetic layer, the resistive layer being interposed between the electrode layer and the first region.

The second unit may include at least one conducting wire connected to the first unit.

The first unit may include a lower unit and an upper unit respectively disposed on the lower surface and the upper surface of the first region, any one of the lower unit and the upper unit being connected to a first conducting wire and the other one of the lower unit and the upper unit being connected to a second conducting wire, and at least one of the first and second conducting wires being included in the second unit.

The first conducting wire may include a first portion extending from the first unit and the first portion of the first conducting wire is disposed on a first plane that is parallel to the magnetic layer.

The second conducting wire may include a first portion extending from the first unit and the first portion of the second conducting wire is disposed on a second plane that is parallel to the magnetic layer.

The first portion of the first conducting wire and the first portion of the second conducting wire may extend in a same direction.

The first conducting wire may further include a second portion extending from the first portion and surrounding at least a portion of the first unit on the first plane.

The first conducting wire may further include a second portion extending from the first portion of the first conducting wire and surrounding at least a portion of the first unit on the first plane.

The second conducting wire may further include a second portion extending from the first portion of the second conducting wire and surrounding at least a portion of the first unit on the second plane.

The direction in which the second portion of the first conducting wire extends and the direction in which the second portion of the second conducting wire extends may be opposite to each other.

The device may further include: a first line that is parallel to the magnetic layer; second and third lines crossing the first line; and a switching device disposed at the intersection of the first wire and the second wire; wherein the switching device and the third line are respectively connected to the first conducting wire and the second conducting wire.

The second line may be included to pass above the first unit and the third line may be included to space apart from the second line by a predetermined interval.

The second and third lines may be spaced apart from one side of the first unit by a predetermined interval.

The device may further include fourth and fifth lines respectively connected to one end and another end of the magnetic layer.

The device may further include another switching device disposed at least one of between the one end of the magnetic layer and the fourth line and between the other end of the magnetic layer and the fifth line.

The device may further include a sixth line connected to the other switching device which crosses the fourth and fifth lines.

The first and sixth lines may be word lines and the second through fifth lines may be bit lines.

The first unit may further include an information reproduction function.

The first unit may be disposed at the center portion of the magnetic layer.

The magnetic layer, the first unit, the first conducting wire, and the second conducting wire may be included in one unit memory region, and the information storage device may include a plurality of unit memory regions equivalent to the unit memory region.

According to another aspect of the present invention, there is provided a method of operating the information storage device of claim 1, the method including: recording information to the first region by applying a write current to the first unit through the second unit.

The method may further include moving magnetic domains and magnetic domain walls in the magnetic layer in units of bits by applying a current to between one end and another end of the magnetic layer.

The method may further include reproducing information recorded in the magnetic layer by applying a read current to between any one of both ends of the magnetic layer and the first unit.

BRIEF DESCRIPTION OF THE DRAWINGS

The above and other features and advantages of the present invention will become more apparent by describing in detail example embodiments thereof with reference to the attached drawings in which.

DETAILED DESCRIPTION OF EXAMPLE EMBODIMENTS

Figure 1:
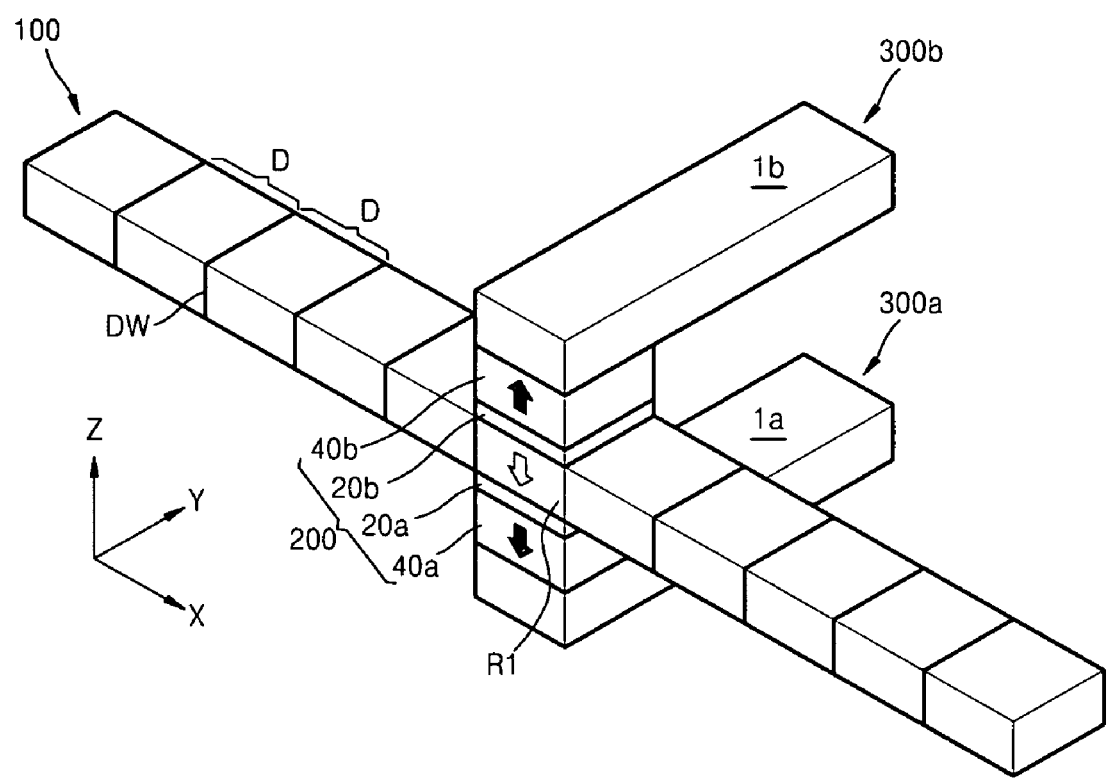
FIGS. 1 through 3 are perspective views of information storage devices according to embodiments of the present invention.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. This invention may, however, may be embodied in many alternate forms and should not be construed as being limited to only the example embodiments set forth herein.

Accordingly, while example embodiments are capable of various modifications and alternative forms, these embodiments are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to limit the example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

Figure 2:
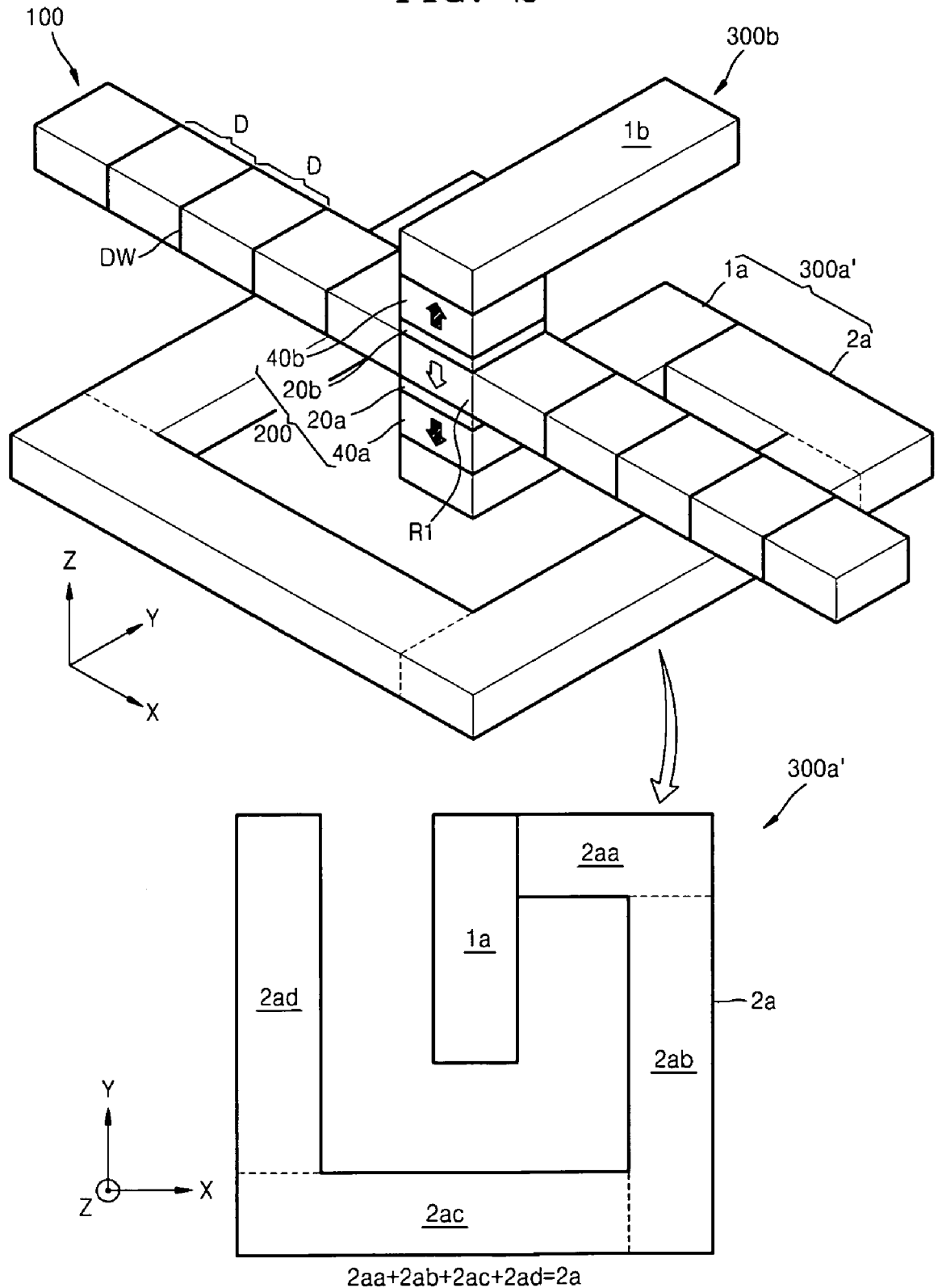
Figure 3:
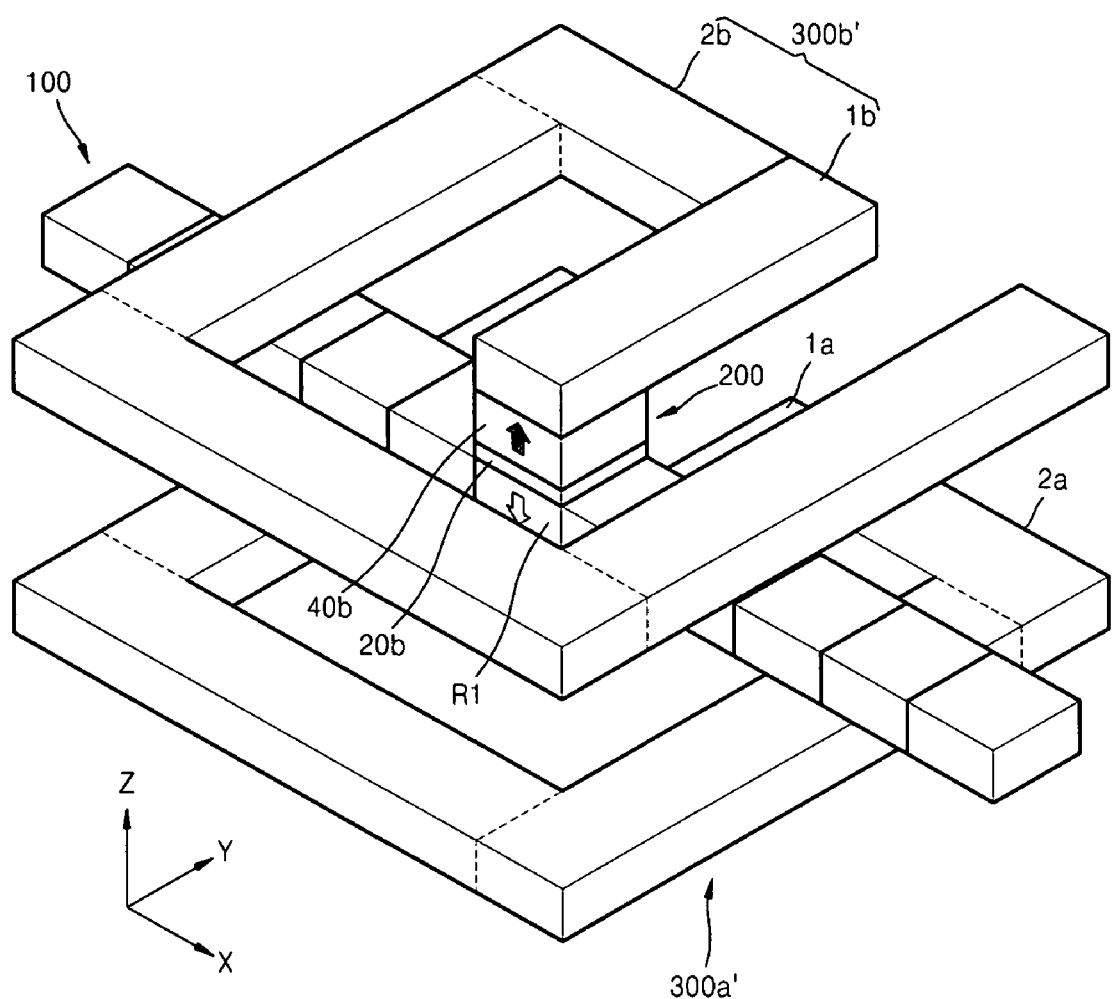

FIGS. 1 through 3 are perspective views of information storage devices according to embodiments of the present invention.

Referring to FIG. 1, a magnetic layer 100 illustrated is, which extends in a predetermined direction, for example, an X-axis direction. The magnetic layer 100 may include a plurality of continuous magnetic domain regions D. A magnetic domain wall region DW may be interposed between two adjacent magnetic domain regions D. The magnetic domain disposed in the magnetic domain regions D and the magnetic domain wall disposed in the magnetic domain wall region DW may be moved in a predetermined direction due to a current applied to the magnetic layer 100. That is, the magnetic layer 100 may have a magnetic domain wall motion characteristic. Such a magnetic layer 100 may be an information storage layer formed of a ferromagnetic substance.

A writing unit 200 may be provided on a first region R1 which is one of the magnetic domain regions D in the magnetic layer 100. The writing unit 200 may be a device for recording information to the first region R1 using a spin transfer torque. For example, the writing unit 200 may be a device using a tunnel magneto resistance (TMR) effect (hereinafter, referred to as a TMR device) or may be a device using a giant magneto resistance (GMR) effect (hereinafter, referred to as a GMR device). More specifically, the writing unit 200 may include a first pinned layer 40a disposed on one of a lower surface and an upper surface of the first region R1, for example, the lower surface of the first region R1, and may include a first separation layer 20a interposed between the first pinned layer 40a and the first region R1. As such, the first separation layer 20a and the first pinned layer 40a disposed on the lower surface of the first region R1 may be denoted as a lower unit of the writing unit 200. Moreover, the writing unit 200 may further include a second pinned layer 40b disposed on another one of a lower surface and an upper surface of the first region R1, for example, the upper surface of the first region R1, and may further include a second separation layer 20b interposed between the second pinned layer 40b and the first region R1. The second separation layer 20b and the second pinned layer 40b disposed on the upper surface of the first region R1 may be denoted as an upper unit of the writing unit 200. The first separation layer 20a and the second separation layer 20b may be insulation layers or conductive layers. When the first separation layer 20a and the second separation layer 20b are the insulation layers, the writing unit 200 is the TMR device and when the first separation layer 20a and the second separation layer 20b are the conductive layers, the writing unit 200 is the GMR device. When the first separation layer 20a and the second separation layer 20b are the conductive layers, a resistive layer (not shown) having a higher electric resistance than that of the magnetic layer 100 may be further interposed between the first region R1 and the first separation layer 20a and between the first region R1 and the second separation layer 20b. When a current for the magnetic domain and magnetic domain wall motion is applied to the magnetic layer 100, the resistive layer may function as an electric barrier which prevents the current from being leaked to the writing unit 200 and when a current is applied between a first conducting wire 300a and a second conducting wire 300b, the resistive layer may not disturb the flow of current. Accordingly, the resistive layer may be formed of a material having an appropriate electric resistance with an appropriately small thickness. For example, the specific resistance of the resistive layer may be 500-10000 times higher than that of the magnetic layer 100, for example, 1000-3000 times higher. In order to achieve this resistance difference, the magnetic layer 100 may be formed of any one of NiFe, Co, CoNi, CoFe, CoCr, CoCu, NiCu, FePt, FePd, CoCrPt, CoFeTb, CoFeGd, CoTb, and CoFeNi and the resistive layer may be formed of any one of amorphous CoZrNb and CoFeB or may be formed of a magnetic material including impurities such as Si and B so as to have a high resistivity. The first pinned layer 40a and the second pinned layer 40b may be ferromagnetic layers of which magnetization directions are fixed and the magnetization directions of the first pinned layer 40a and the second pinned layer 40b may be opposed to each other. Arrows illustrated in the first pinned layer 40a, the second pinned layer 40b, and the first region R1 of FIG. 1 indicate each of the magnetization directions thereof. The directions of the arrows are in a z-axis direction or a reversed direction thereof. That is, when the first pinned layer 40a, the second pinned layer 40b, and the first region R1 have perpendicular magnetic anisotropy, these arrows indicate the magnetization directions of the first pinned layer 40a, the second pinned layer 40b, and the first region R1. The magnetization directions of the first pinned layer 40a and the second pinned layer 40b may be switched around and the magnetization direction of the first region R1 may be opposite to that of the arrow shown in FIG. 1. The first region R1 may not be in a magnetized state in a specific direction. When the magnetic layer 100, the first pinned layer 40a, and the second pinned layer 40b have horizontal magnetic anisotropy, the first region R1, the first pinned layer 40a, and the second pinned layer 40b may have magnetization directions that are parallel to an x-axis (or a y-axis). Although not shown in FIG. 1, other magnetic domain regions D, except for the first region R1, may also be magnetized in a direction that is the same as the first region R1 or a direction that is opposite to the first region R1 in the magnetic layer 100.

The first conducting wire 300a and the second conducting wire 300b may be respectively disposed on the lower surface and the upper surface of the writing unit 200. In other words, the first conducting wire 300a may be disposed on the lower surface of the lower unit of the writing unit 200 and the second conducting wire 300b may be disposed on the upper surface of the upper unit of the writing unit 200. A predetermined write current may be applied to the writing unit 200 through the first conducting wire 300a and the second conducting wire 300b. The first conducting wire 300a may include a first portion 1a extended in a predetermined direction from the lower surface of the writing unit 200. Similarly, the second conducting wire 300b may include a first portion 1b extended in a predetermined direction from the upper surface of the writing unit 200. The first portion 1a of the first conducting wire 300a and the first portion 1b of the second conducting wire 300b may be extended in a direction perpendicular to the writing unit 200. In other words, the first portion 1a of the first conducting wire 300a and the first portion 1b of the second conducting wire 300b may be disposed on each different plane (hereinafter, respectively referred to as a first XY plane and a second XY plane) parallel to the plane on which the magnetic layer 100 is formed. The first portion 1a of the first conducting wire 300a and the first portion 1b of the second conducting wire 300b may be extended in the same direction. In the current embodiment, the first portion 1a of the first conducting wire 300a and the first portion 1b of the second conducting wire 300b are extended in a Y-axis direction. However, the first portion 1a of the first conducting wire 300a and the first portion 1b of the second conducting wire 300b may be extended in various directions. That is, the directions in which the first portion 1a of the first conducting wire 300a and the first portion 1b of the second conducting wire 300b are extended may be arbitrarily determined within the first XY plane and the second XY plane on which the first portions 1a and 1b are respectively disposed.

Although not shown in FIG. 1, at least one layer may be further interposed between the first pinned layer 40a and the first conducting wire 300a so as to fix the magnetization direction of the first pinned layer 40a. Similarly, at least one layer may be further interposed between the second pinned layer 40b and the second conducting wire 300b so as to fix the magnetization direction of the second pinned layer 40b. The at least one layer used to fix the magnetization direction of the first pinned layer 40a or the second pinned layer 40b may include anti-ferromagnetic layer and may have various structures. The structure would have been obvious to one of ordinary skill in the art and it would also have been obvious to one of ordinary skill in the art to further include a contact electrode layer respectively between the first conducting wire 300a and the writing unit 200, and the second conducting wire 300b and the writing unit 200.

According to other embodiments, the first conducting wire 300a and/or the second conducting wire 300b in the information storage device of FIG. 1 may have various forms. Examples of these forms are described with reference to FIGS. 2 and 3.

Referring to a perspective view and a partial plan view illustrated in FIG. 2, a first conducting wire 300a' may include the first portion 1a extended from the lower surface of the writing unit 200 and may further include a second portion 2a extended from the first portion 1a. The second portion 2a may surround at least some portion of the writing unit 200 on the plane on which the first portion 1a is formed, that is, on the first XY plane. The second portion 2a may have an angulated structure in which at least one straight line constituent is connected. In the current embodiment, the second portion 2a includes a first constituent 2aa, a second constituent 2ab, a third constituent 2ac, and a fourth constituent 2ad, wherein the first constituent 2aa is extended in an x-axis direction from the first portion 1a, the second constituent 2ab is extended in a negative y-axis direction from the first constituent 2aa, the third constituent 2ac is extended in a negative x-axis direction from the second constituent 2ab, and the fourth constituent 2ad is extended in a y-axis direction from the third constituent 2ac. However, the present invention is not limited thereto. For example, the fourth constituent 2ad or the third constituent 2ac and the fourth constituent 2ad or the second constituent 2ab through the fourth constituent 2ad may not be included in the second portion 2a and another conducting wire constituent may be further included in the end of the second portion 2a. Moreover, the second portion 2a may have a curved structure, instead of the angulated structure.

The second conducting wire 300b of FIG. 2 may also be transformed as in the first conducting wire 300a.' An example is shown in FIG. 3.

Referring to FIG. 3, a second conducting wire 300b' may include the first portion 1b extended from the upper surface of the writing unit 200 and may further include a second portion 2b extended from the first portion 1b. The second portion 2b may surround at least some portion of the writing unit 200 on the plane on which the first portion 1b is formed, that is, the second XY plane. The second portion 2b of the second conducting wire 300b' may be extended from the first portion 1b in a direction opposite to the direction in which the second portion 2a of the first conducting wire 300a' is extended from the first portion 1a. The second portion 2b of the second conducting wire 300b' may also have various transformed structures as in the second portion 2a of the first conducting wire 300a'. The direction to which the second portion 2a of the first conducting wire 300a' is extended and the direction to which the second portion 2b of the second conducting wire 300b' may be switched around. Also, the first conducting wire 300a' in FIG. 3 may be transformed as in the first conducting wire 300a of FIG. 1. Moreover, the first conducting wires 300a and 300a' and the second conducting wires 300b and 300b' may be close to the first region R1.

In the information storage device of FIGS. 1 through 3, the first conducting wires 300a and 300a' and the second conducting wires 300b and 300b' may be configured to apply a predetermined magnetic field to the first region R1 while a write operation is being performed. The magnetic field may be applied to the first region R1 in a direction suitable to support the write operation. That is, the first conducting wires 300a and 300a' and the second conducting wires 300b and 300b' may induce the magnetic field to record information in the first region R1 by a current passing therethrough. Thus, the first conducting wires 300a and 300a' and the second conducting wires 300b and 300b' are means for applying the magnetic field to record information in the first region R1 and may be denoted as a 'second unit' for information recording. More specifically, when a write operation is performed for recording information to the first region R1 by applying a write current to the writing unit 200 through the first conducting wires 300a and 300a' and the second conducting wires 300b and 300b', the magnetic field for supporting the write operation is generated in the first conducting wires 300a and 300a' and the second conducting wires 300b and 300b' by the write current. Of course, a spin transfer torque is applied from the writing unit 200 to the first region R1 by the write current. In other words, in the current embodiment, the spin transfer torque of the writing unit 200 and the magnetic field generated in the first conducting wires 300a and 300a' and the second conducting wires 300b and 300b' are used to perform the write operation. Accordingly, according to the current embodiment of the present invention, the write operation can be easily performed even with a small current density. When the write current density decreases, consumed power can be reduced and reliability of the writing unit 200 can be improved. When the write current density is high as is generally the case, characteristics of the writing unit 200 may be degraded and when the first and second separation layers 20a and 20b are the insulation layers, the first and second separation layers 20a and 20b may be broken down.

Hereinafter, an information recording method using an information storage device according to an embodiment of the present invention will be described in more detail.

Figure 4A:
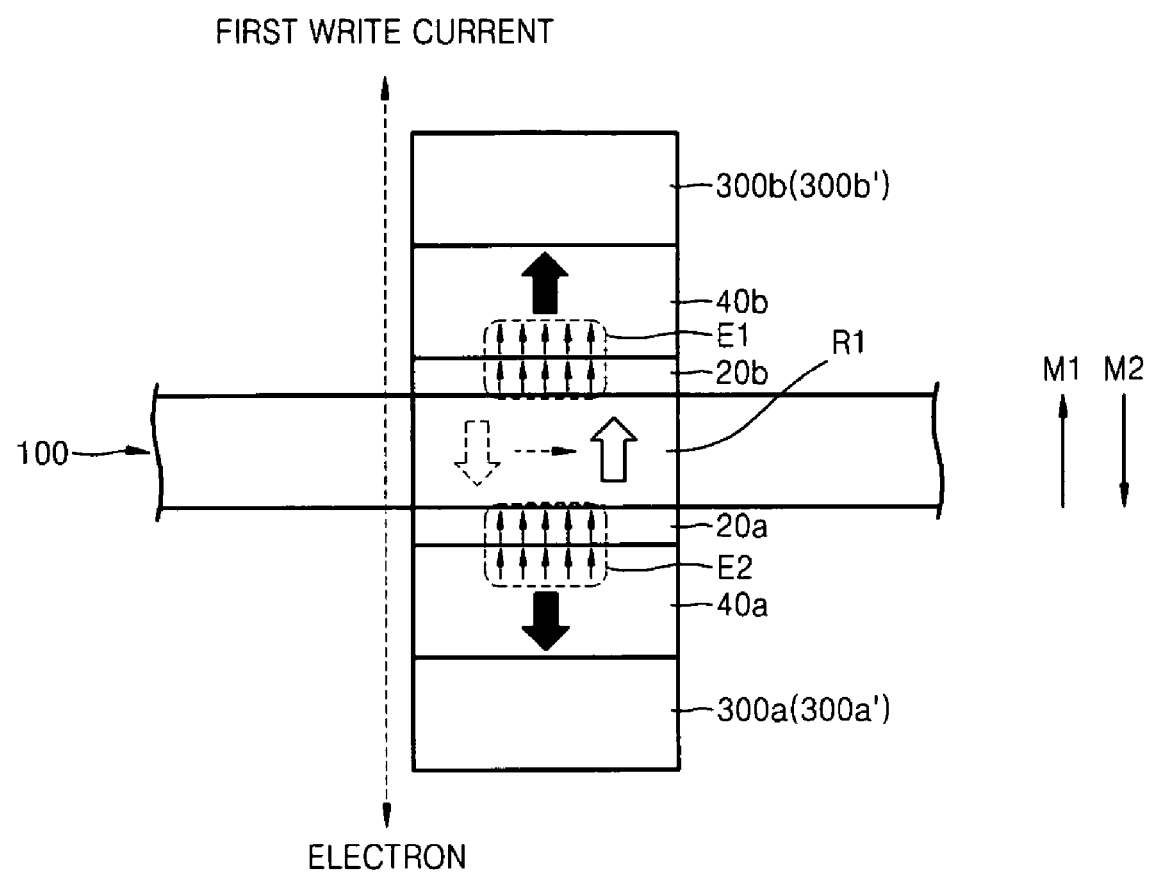
FIGS. 4A and 4B are cross-sectional views of an information storage device according to an embodiment of the present invention for illustrating a write operation.
Figure 4B:
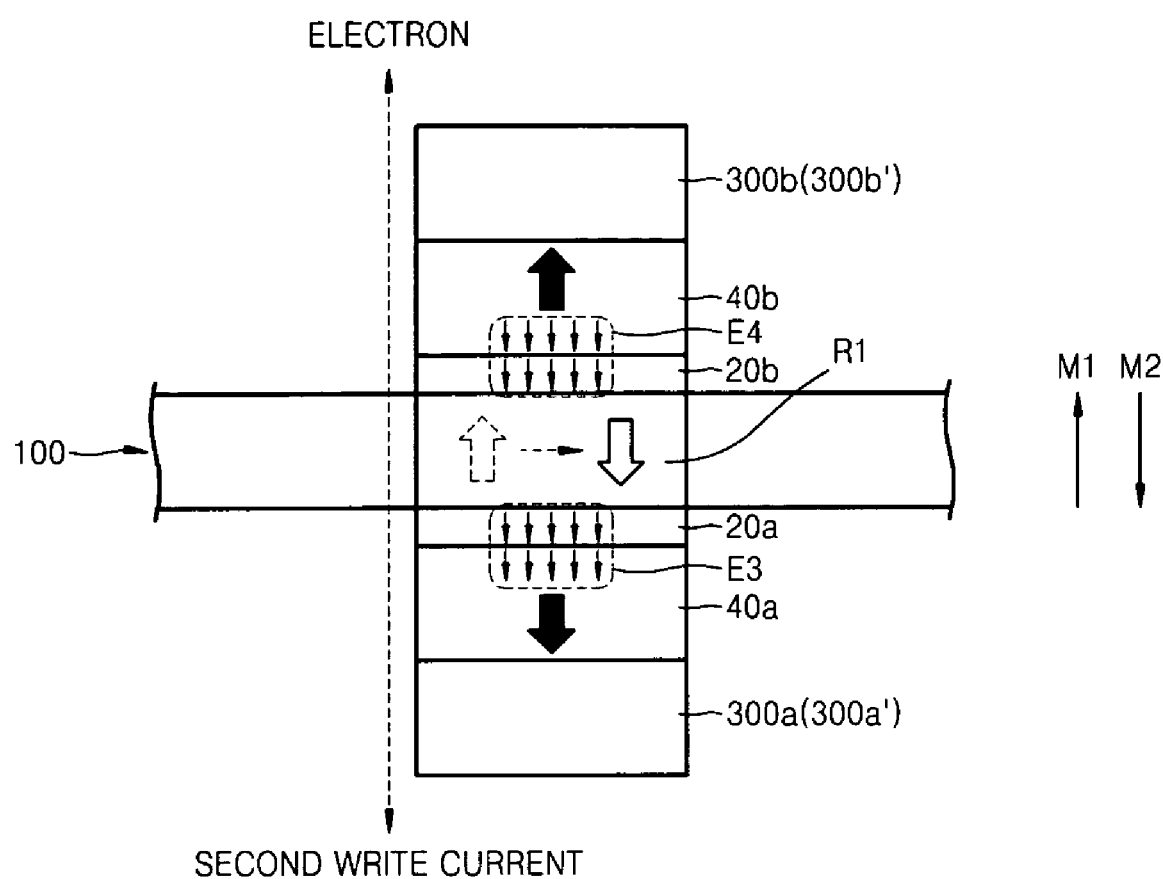

FIGS. 4A and 4B are cross-sectional views of an information storage device according to an embodiment of the present invention for illustrating a write operation. In FIGS. 4A and 4B, a partial cross-sectional configuration of an information storage device according to an embodiment of the present invention is illustrated and the cross-sectional configuration may be the same with those of FIGS. 1 through 3.

Referring to FIG. 4A, when a first write current is applied from the first conducting wire 300a or 300a' to the second conducting wire 300b or 300b' and electrons are moved from the second conducting wire 300b or 300b' to the first conducting wire 300a or 300a', electrons E1 having a magnetization direction M1 that is the same as the magnetization direction of the second pinned layer 40b (hereinafter, referred to as a first direction) are moved from the second conducting wire 300b or 300b' to the first region R1. These electrons E1 magnetize the first region R1 in the first direction M1. Meanwhile, in the first pinned layer 40a, electrons having a magnetization direction M2 that is the same as the magnetization direction of the first pinned layer 40a (hereinafter, referred to as a second direction) flow out to the first conducting wire 300a or 300a' through the first pinned layer 40a. However, electrons E2 having magnetization directions that are opposite the magnetization direction of the first pinned layer 40a cannot flow out through the first pinned layer 40a and instead, are returned and accumulate in the first region R1. These electrons E2 magnetize the first region R1 in the first direction M1. As such, the first region R1 may be magnetized in the first direction M1 by the spin transfer torque applied from the first pinned layer 40a and the second pinned layer 40b to the first region R1. When the first region R1 is magnetized in the second direction M2 before the first write current is applied thereto, the magnetization direction of the first region R1 may be reversed to be in the first direction M1 by the first write current.

Referring to FIG. 4B, when a second write current is applied from the second conducting wire 300b or 300b' to the first conducting wire 300a or 300a' and electrons are moved from the first conducting wire 300a or 300a' to the second conducting wire 300b or 300b', electrons E3 magnetized in the second direction M2 are moved from the first conducting wire 300a or 300a' to the first region R1. These electrons E3 magnetize the first region R1 in the second direction M2. Meanwhile, in the second pinned layer 40b, electrons magnetized in the first direction M1 flow out to the second conducting wire 300b or 300b' through the second pinned layer 40b. However, electrons E4 magnetized in the second direction M2 cannot flow out through the second pinned layer 40b and instead, are returned and accumulate in the first region R1. These electrons E4 magnetize the first region R1 in the second direction M2.

When the first region R1 is magnetized in the first direction M1 before the second write current is applied thereto, the magnetization direction of the first region R1 may be reversed to be in the second direction M2 by the second write current.

The magnetic domains and the magnetic domain walls may be moved in a predetermined direction within the magnetic layer 100 by one bit-distance due to a predetermined current applied to the magnetic layer 100 during operations between FIG. 4A and FIG. 4B, before the operation of FIG. 4A, or after the operation of FIG. 4B. While the magnetic domains and the magnetic domain walls are moved within the magnetic layer 100 in units of bits, the magnetic domains located in the first region R1 are magnetized in a desired direction using the operation of FIG. 4A or FIG. 4B so that predetermined information can be recorded to a part of or to the entire magnetic layer 100.

As such, since the first pinned layer 40a and the second pinned layer 40b which are magnetized in each different direction are respectively disposed on the lower surface and the upper surface of the magnetic layer 100 in the information storage device according to the current embodiment, information can be recorded by the spin transfer torque induced from both the first pinned layer 40a and second pinned layer 40b. Thus, the write current density may be reduced and the write operation is rapidly performed, compared to when one pinned layer is used.

In addition, in the information storage device according to an embodiment of the present invention, the magnetic field to support the write operation is generated in the first conducting wire 300a or 300a' and the second conducting wire 300b or 300b' by the write current (the first and second write current), as described above. Therefore, the write current density may be reduced more and the write operation may be performed more rapidly, due to the magnetic field. This will be described in more detail with reference to FIGS. 5 through 7.

Figure 5:
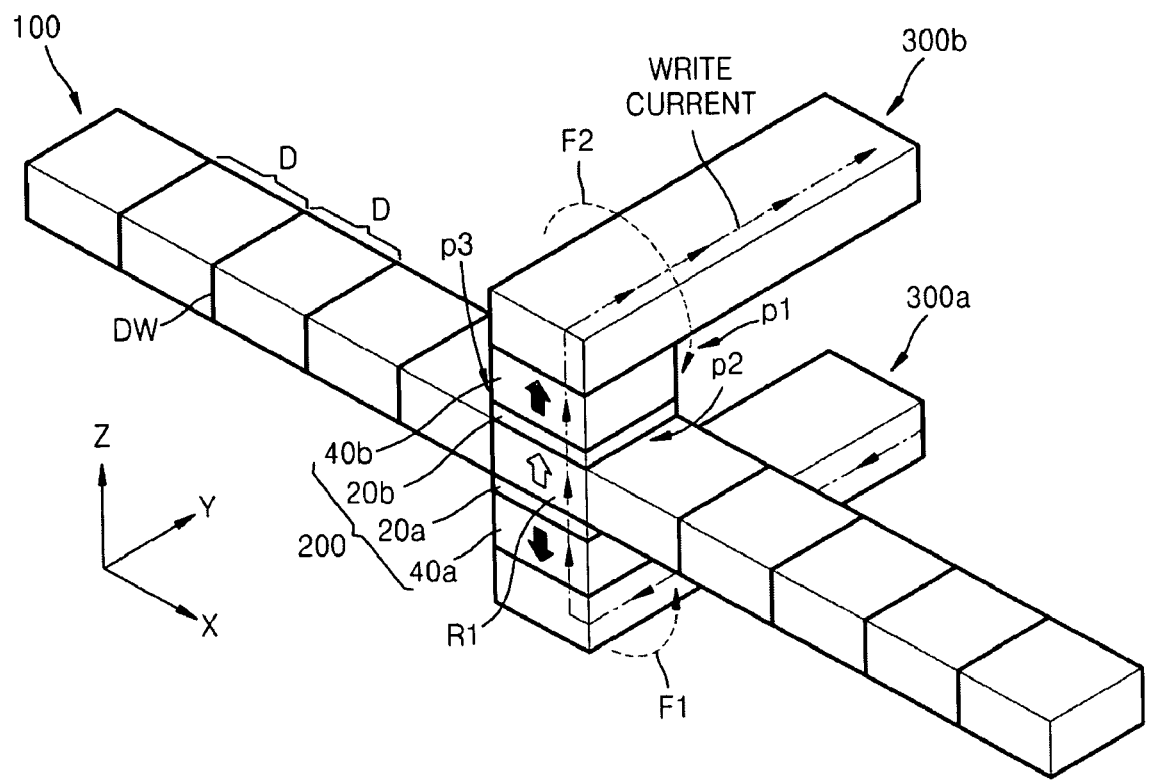
FIGS. 5, 6, and 7 are perspective views of information storage devices according to embodiments of the present invention, illustrating magnetic fields generated by applying a write current to the information storage devices.

FIG. 5 illustrates a first magnetic field F1 and a second magnetic field F2 when the write current is applied from the first conducting wire 300a to the second conducting wire 300b in FIG. 1, the first magnetic field F1 being induced from the first conducting wire 300a by the write current and the second magnetic field F2 being induced from the second conducting wire 300b by the write current. These first and second magnetic fields F1 and F2 are generated in compliance with the right hand rule. Although not shown in FIG. 5, a magnetic field is also generated surrounding the writing unit 200 by the write current passing through the writing unit 200. Such a magnetic field is also generated in FIGS. 6 and 7.

The first and second magnetic fields F1 and F2 of FIG. 5 may act advantageously for the magnetization reversal (e.g., write operation) of the first region R1. The X-axis magnetic field of approximately −47 Oe is applied to a first point p1 of the first region R1. This denotes that a relatively strong magnetic field is applied to the first point p1 in a negative X-axis direction. The first point p1 is a central point at the center of one end in the Y-axis direction. The relatively strong magnetic field is applied to the first point p1 in a negative X-axis direction because the first and second conducting wires 300a and 300b in FIG. 5 are extended to the Y-axis and the first and second magnetic fields F1 and F2 generated from the first and second conducting wires 300a and 300b has directions opposite to the X-axis at the first point p1. The magnetic field is applied to most of the first region R1 in a direction opposite to the X-axis based on the first point p1. The X-axis constituent magnetic field supports the first region R1 in magnetization reversal during the write operation as in FIG. 4A. That is, when the magnetization direction of the first region R1 of FIG. 4A is changed from the second direction M2 to the first direction M1 that is the direction opposite to the second direction M2, the X-axis constituent magnetic field may act advantageously for the magnetization reversal of the first region R1.

The Y-axis magnetic field of approximately 20 Oe and −20 Oe is respectively applied to two points (hereinafter, referred to as a second point p2 and a third point p3) located at both sides of the first region R1. This is because the magnetic field is applied to the second point p2 in the Y-axis direction by the writing unit 200 of FIG. 5 and the magnetic field is applied to the third point p3 in a direction opposite to the Y-axis direction by the writing unit 200 of FIG. 5. However, the Y-axis constituent magnetic field may not be applied to most of the first region R1. Thus, the Y-axis constituent magnetic field may not affect the magnetization reversal of the first region R1.

The Z-axis constituent magnetic field which is applied to the magnetic layer 100 is 0 Oe. This denotes that the available magnetic field constituent applied to the magnetic layer 100 in the Z-axis direction or a direction opposite to the Z-axis direction does not exist.

Figure 6:
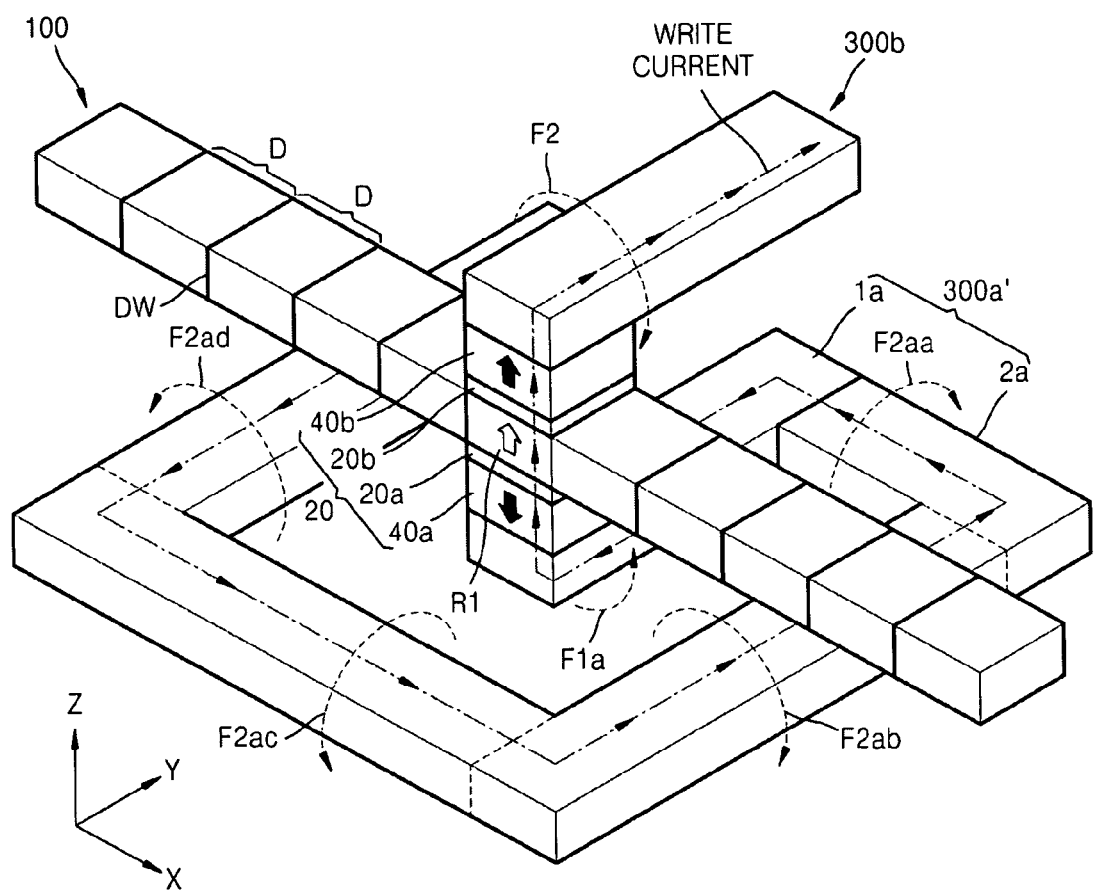

FIG. 6 illustrates a first magnetic field F1' and the second magnetic field F2 when the write current is applied from the first conducting wire 300a' to the second conducting wire 300b in FIG. 2, the first magnetic field F1' being induced from the first conducting wire 300a' by the write current and the second magnetic field F2 being induced from the second conducting wire 300b by the write current. The first magnetic field F1' may be classified into a first portion magnetic field F1a induced from the first portion 1a and the second portion magnetic field F2aa+F2ab+F2ac+F2ad induced from the second portion 2a. The first portion magnetic field F1a may be equivalent to the first magnetic field F1 of FIG. 5.

The first and second magnetic fields F1 and F2 of FIG. 6 may act advantageously for the magnetization reversal (e.g., write operation) of the first region R1. (X) and (Y) in FIG. 6 are respectively similar to (X) and (Y) in FIG. 5. However, referring to (Z) in FIG. 6, unlike (Z) in FIG. 5, the magnetic field of approximately 6.6 Oe is applied to the first region R1 in a Z-axis direction. This may be caused by the second portion magnetic field F2aa+F2ab+F2ac+F2ad. The Z-axis constituent magnetic field supports the first region R1 in magnetization reversal during the write operation as in FIG. 4A. More specifically, when the magnetization direction of the first region R1 of FIG. 4A is changed from the second direction M2 to the first direction M1 that is the direction opposite to the second direction M2, it may be advantageous that the Z-axis constituent magnetic field be applied to the first region R1 so as to perform the magnetization reversal. That is, since the Z-axis constituent magnetic field is applied to the first region R1 in the first direction M1 of FIG. 4A, the magnetization direction of the first region R1 may be easily changed to the first direction M1.

As shown in FIG. 6, since the X-axis and Z-axis constituent magnetic fields support the magnetization reversal of the first region R1, the magnetization reversal of the first region R1 may be more facilitated than the case of FIG. 5 in which the Z-axis constituent magnetic field is not applied to the first region R1.

Figure 7:
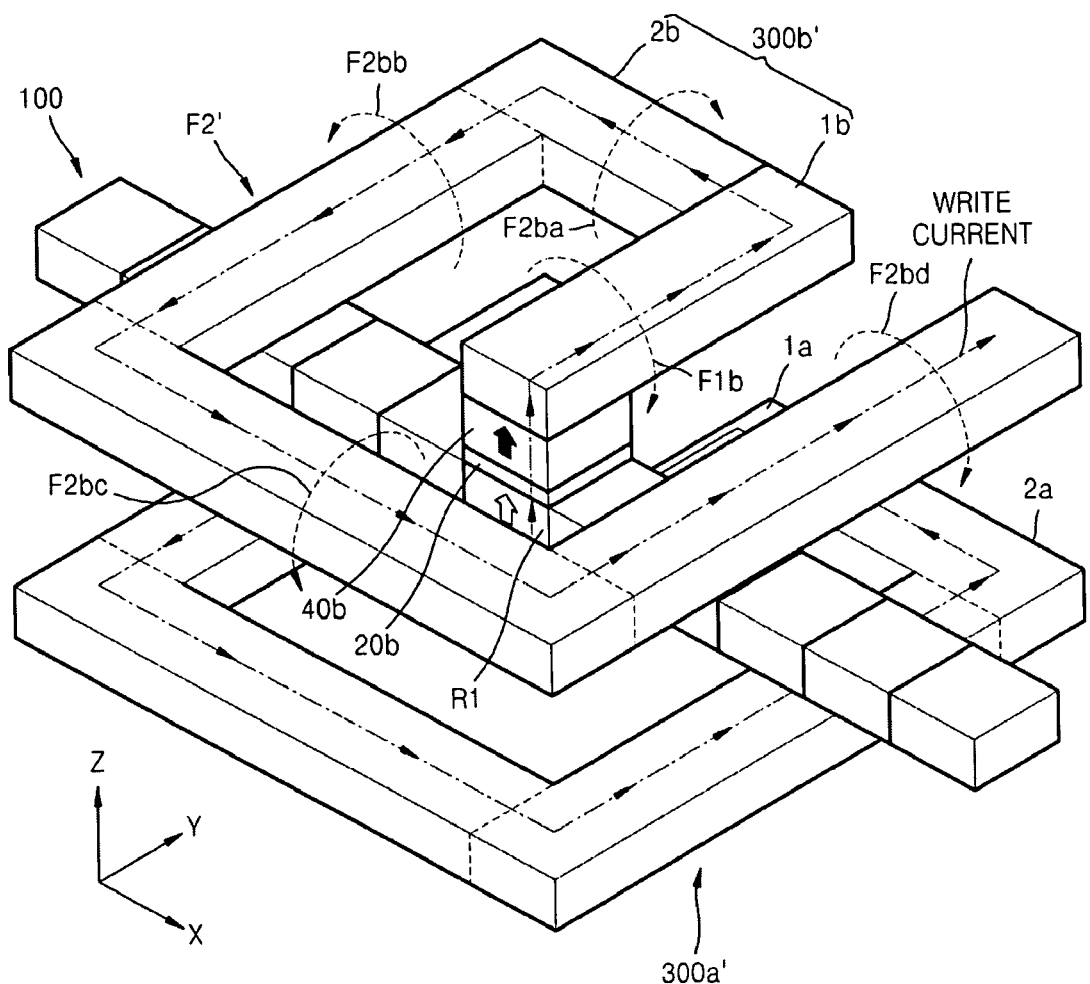

In FIG. 7, when the write current is applied from the first conducting wire 300a' to the second conducting wire 300b', the first magnetic field (not shown) is induced from the first conducting wire 300a' by the write current and a second magnetic field F2' is induced from the second conducting wire 300b' by the write current. The first magnetic field (not shown) may be the same as the first magnetic field F1' of FIG. 6. The second magnetic field F2' may be classified into a first portion magnetic field F1b induced from the first portion 1b and the second portion magnetic field F2ba+F2bb+F2bc+F2bd induced from the second portion 2b.

The first and second magnetic fields F1 and F2 of FIG. 7 may act advantageously for the magnetization reversal (e.g., write operation) of the first region R1. (X) and (Y) in FIG. 7 are respectively similar to (X) and (Y) in FIG. 5. Meanwhile, referring to (Z) in FIG. 7, the magnetic field of approximately 13 Oe is applied to the first region R1 in a Z-axis direction. The intensity of the magnetic field is approximately double the intensity of the Z-axis constituent magnetic field of FIG. 6. The Z-axis constituent magnetic field may be caused by the magnetic field generated from the second portion 2a of the first conducting wire 300a in FIG. 7 (same as F2aa+F2ab+F2ac+F2ad in FIG. 6) and by the second portion magnetic field F2ba+F2bb+F2bc+F2bd generated from the second portion 2b of the second conducting wire 300b. Since the Z-axis constituent magnetic field of FIG. 7 is stronger than that of FIG. 6, magnetization reversal of the first region R1 may be more facilitated in FIG. 7.

In FIGS. 5 through 7, the write current is applied from the first conducting wires 300a and 300a' to the second conducting wires 300b and 300b' and the first region is magnetized in a Z-axis direction. However, the effect of the magnetic field described above is similar when the write current is applied from the second conducting wires 300b and 300b' to the first conducting wires 300a and 300a' and the first region R1 is magnetized in a direction opposite to the Z-axis direction. That is, when the write current is applied from the second conducting wires 300b and 300b' of FIGS. 5, 6, and 7 to the first conducting wires 300a or 300a', the magnetic field may be applied to the first region R1 of FIGS. 5, 6, and 7 in an X-axis direction and the magnetic field may be applied to the first region R1 of FIGS. 6 and 7 in a direction opposite to the Z-axis direction. Due to these magnetic fields, the write operation magnetizing the first region R1 in a Z-axis direction may be facilitated.

In addition, in FIGS. 5 through 7, the magnetic fields supporting the write operation are generated from all first conducting wires 300a and 300a' and the second conducting wires 300b and 300b'. However, according to other embodiments, any one of the first conducting wires 300a and 300a' and the second conducting wires 300b and 300b' may be changed so as not to generate the magnetic field which substantially supports the write operation. That is, the magnetic fields generated from all first conducting wires 300a and 300a' and the second conducting wires 300b and 300b' are not always needed for the advantage of the present invention. In other words, the advantage of the present invention can be obtained only with the magnetic field generated from at least one of first conducting wires 300a and 300a' and the second conducting wires 300b and 300b'.

The information storage device of FIGS. 1 through 3 respectively includes the first pinned layer 40a and the second pinned layer 40b on the lower surface and the upper surface of the first region R1 in the magnetic layer 100. However, in another embodiment, only one pinned layer may be used and an example thereof is illustrated in FIG. 8.

Figure 8:
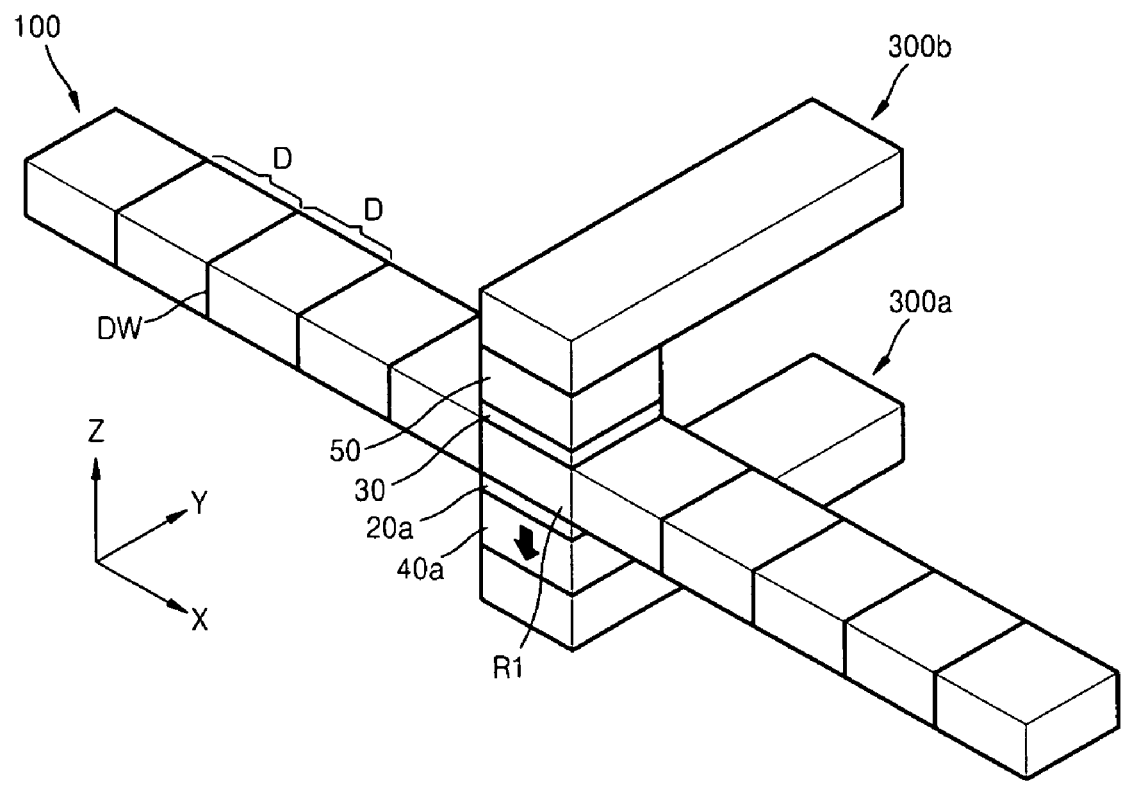
FIG. 8 is a perspective view of an information storage device according to another embodiment of the present invention.

FIG. 8 is a perspective view of an information storage device according to another embodiment of the present invention.

Referring to FIG. 8, a resistive layer 30 and an electrode layer 50 are sequentially disposed in that order on the first region R1 and the second conducting wire 300b is disposed on the electrode layer 50.

The resistive layer 30 is a layer having a higher electric resistance than that of the magnetic layer 100 and may function as an electric barrier to prevent a current from being leaked to the electrode layer 50, when the current for the magnetic domain wall motion flows through the magnetic layer 100. However, when the write current is applied from the first conducting wire 300a to the second conducting wire 300b or vice versa, the resistive layer 30 may not prevent the write current from flowing. Properties and forming materials of the resistive layer 30 may be the same as those of the resistive layer described with reference to FIG. 1. In some cases, the second conducting wire 300b may be directly disposed on the resistive layer 30 without the electrode layer 50. The lower structure of the first region R1 in FIG. 8 may be the same as that of FIG. 1. That is, the first separation layer 20a, the first pinned layer 40a, and the first conducting wire 300a may be sequentially disposed in this order on the lower surface of the first region R1. When the first separation layer 20a is a conductive layer, another resistive layer (not shown) may be interposed between the first region R1 and the first separation layer 20a. The other resistive layer (not shown) may be similar to the resistive layer 30. The first conducting wire 300a and/or the second conducting wire 300b of FIG. 8 may be transformed as in the first conducting wire 300a' and/or the second conducting wire 300b' of FIG. 3.

Figure 9:
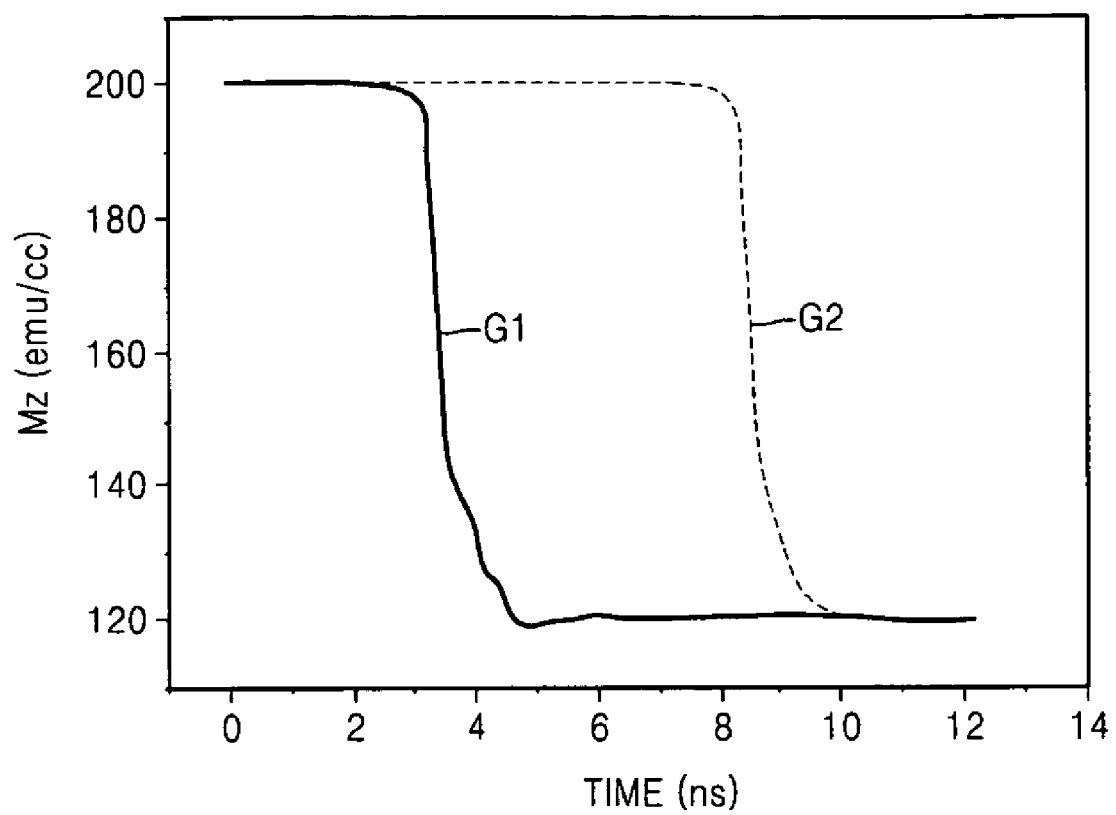
FIG. 9 is a graph showing a magnetization reversal characteristic of a magnetic layer of an information storage device according to an embodiment of the present invention and an information storage device according to a comparison example.

FIG. 9 is a graph showing a magnetization reversal characteristic of the magnetic layer of the information storage device according to an embodiment of the present invention and an information storage device according to a comparison example. In FIG. 9, a first graph G1 indicates a magnetization reversal characteristic of the first region R1 using the information storage device having the structure described in FIG. 1. A second graph G2 indicates a magnetization reversal characteristic of the first region R1 when the write current is applied between the first pinned layer 40a and the second pinned layer 40b in a structure where the first and second conducting wires 300a and 300b are removed, as illustrated in FIG. 1. That is, the result of the second graph G2 corresponds to when the effects of the magnetic fields induced from the first and second conducting wires 300a and 300b in FIG. 1 are removed. A damping constant, a magnetic anisotropy energy density, saturation magnetization Ms, and an exchange constant of the magnetic layer 100 used in obtaining the result of FIG. 9 are approximately 0.1, $10^6$ erg/cc, 200 emu/cc, and $10^6$ erg/cm, respectively. The write current density used for magnetization reversal is approximately $3.8 \times 10^7$ A/cm$^2$.

Referring to FIG. 9, a Z-axis magnetization Mz changes in the first graph G1 5 ns earlier than a Z-axis magnetization Mz changes in the second graph G2. This denotes that the magnetization reversal (that is, information recording) is rapidly and easily performed by the magnetic fields induced from the first and second conducting wires 300a and 300b in the information storage device.

Figure 10:
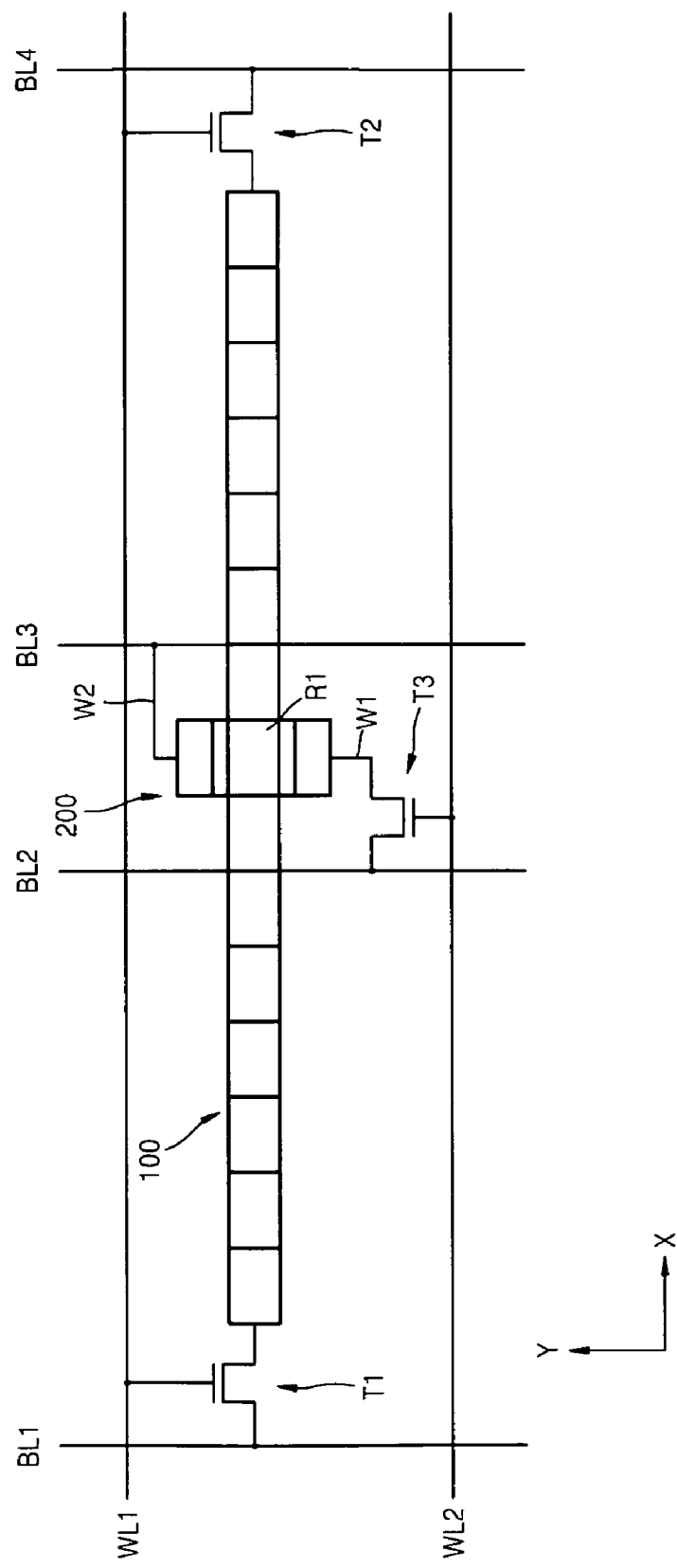
FIG. 10 is a circuit diagram illustrating a unit memory region of an information storage device according to an embodiment of the present invention.

FIG. 10 is a circuit diagram illustrating a unit memory region of the information storage device according to an embodiment of the present invention. In FIG. 10, a direction indicator indicating the XY coordinates indicates directions of first and second word lines WL1 and WL2 and first through fourth bit lines BL1 through BL4, and the directions of the magnetic layer 100 and a first unit 200 are indicated as in the direction indicator illustrated in FIG. 1.

Referring to FIG. 10, the first and second word lines WL1 and WL2 are illustrated extending in a predetermined direction, for example, an X-axis direction, and the first through fourth bit lines BL1 through BL4 crossing the first and second word lines WL1 and WL2 are also illustrated. A first transistor T1 may be disposed at the intersection of the first word line WL1 and the first bit line BL1 and a second transistor T2 may be disposed at the intersection of the first word line WL1 and the fourth bit line BL4. Gates of the first and second transistors T1 and T2 are connected to the first word line WL1. The magnetic layer 100 in which one end and the other end thereof are respectively connected to the first and second transistors T1 and T2 may be interposed between the first and second transistors T1 and T2. The first unit 200 may be disposed in a predetermined region of the magnetic layer 100, for example, the center portion of the magnetic layer 100 (hereinafter, referred to as the first region R1). The configuration of the magnetic layer 100 and the first unit 200 may be the same as that of the magnetic layer 100 and the writing unit 200 of FIGS. 1 through 3. One end of the first unit 200, for example, the upper surface, may be connected to the third bit line BL3 and the other end of the first unit 200, for example, the lower surface, may be connected to a third transistor T3 disposed at the intersection of the second word line WL2 and the second bit line BL2. The gate of the third transistor T3 is connected to the second world line WL2. A conducting wire W1 connecting the other end of the first unit 200 to the third transistor T3 and a conducting wire W2 connecting the one end of the first unit 200 to the third bit line BL3 may include the same structure as that of the first conducting wires 300a and 300a' and the second conducting wires 300b and 300b' of FIGS. 1 through 3 or a structure derived therefrom.

In FIG. 10, since the first through third transistors T1 through T3 are kinds of switching devices, they may be replaced with switching devices having other structures, for example, a diode. At least one of the first and second transistors T1 and T2 may not be included and the location of the second transistor T2 may be changed. For example, the third transistor T3 may be disposed at the intersection of the second word line WL2 and the third bit line BL3, instead of at the intersection of the second word line WL2 and the second bit line BL2. Also, the configuration of the first unit 200 of FIG. 10 may be replaced with the writing unit of FIG. 8.

Hereinafter, a method of operating the information storage device having the structure as illustrated in FIG. 10 is described with reference to FIGS. 11 through 13.

<Write Operation>

Figure 11:
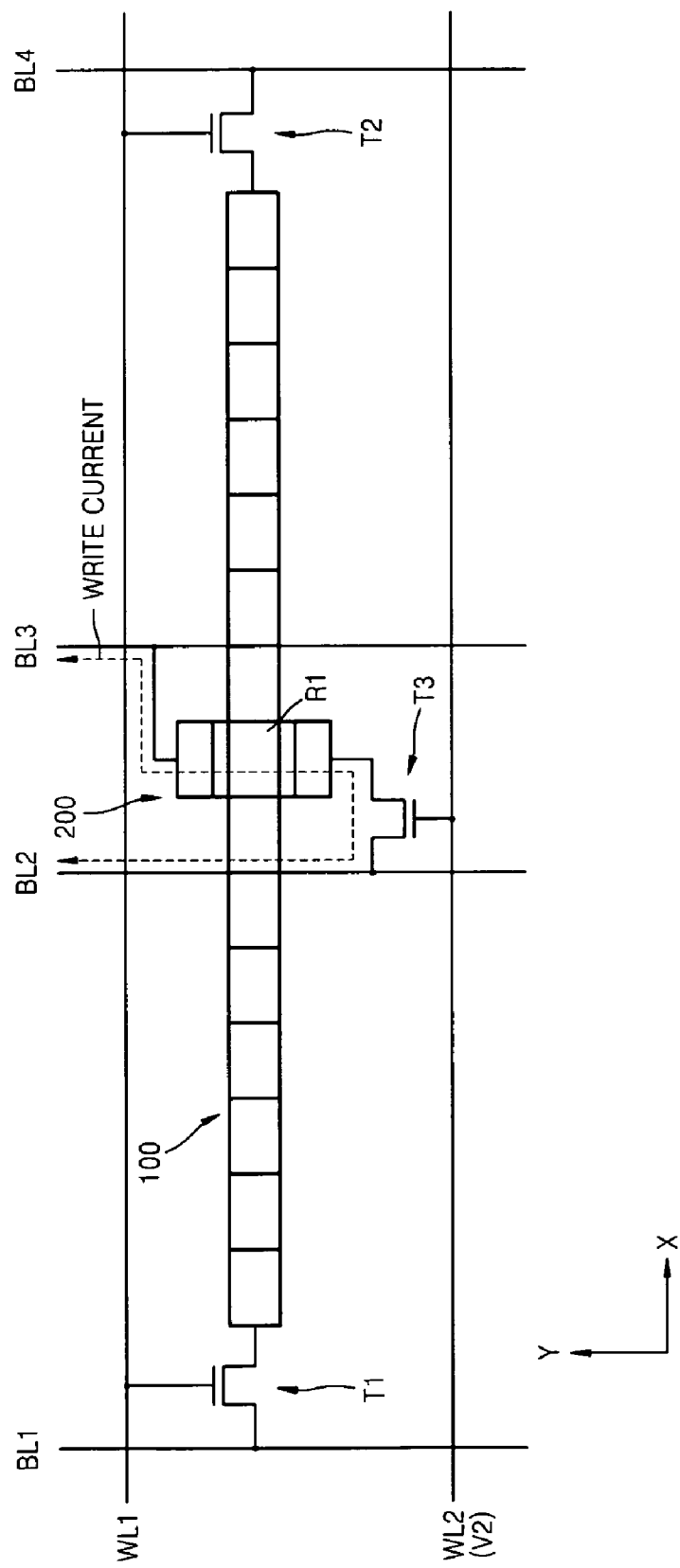
FIGS. 11 through 13 are circuit diagrams illustrating a method of operating the information storage device of FIG. 10.

Referring to FIG. 11, while the gate of the third transistor T3 is open by applying a predetermined voltage V2 to the second word line WL2, a predetermined positive voltage is applied to any one of the second bit line BL2 and the third bit line BL3 and voltage of 0 V is applied to the other one of the second bit line BL2 and the third bit line BL3. Then, the write current may flow in a predetermined direction to the first region R1 through the first unit 200. According to the direction of the write current, the magnetization direction of the first region R1 may vary. In addition, as described above, the magnetic field generated from at least any one of the upper and lower conducting wires connected to the first unit 200 by the write current may support changing of the magnetization direction of the first region R1.

Figure 12:
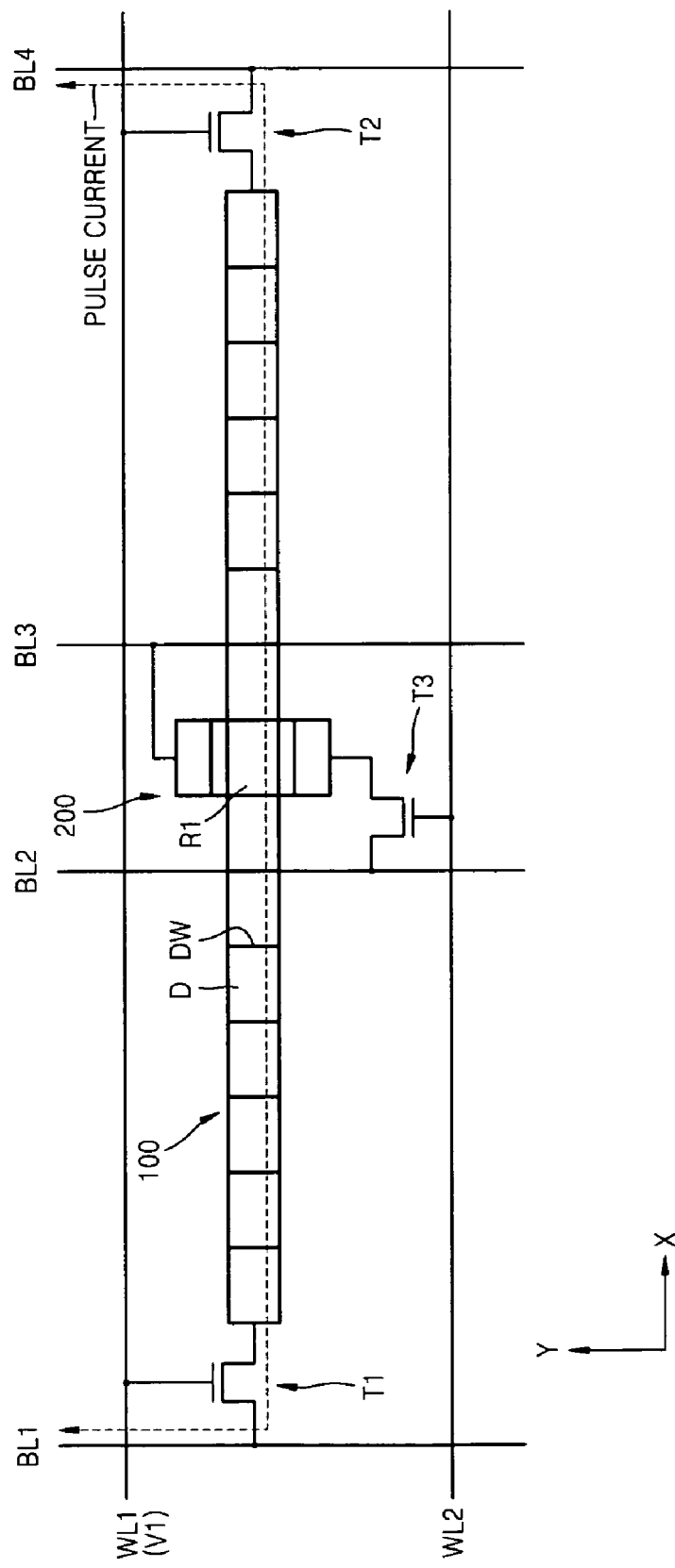

Referring to FIG. 12, while the gates of the first and second transistors T1 and T2 are open by applying a predetermined voltage V1 to the first word line WL1, a predetermined positive pulse voltage is applied to any one of the first bit line BL1 and the fourth bit line BL4 and voltage of 0 V is applied to the other one of the first bit line BL1 and the fourth bit line BL4. Then, a pulse current may flow through the magnetic layer 100 due to the pulse voltage and thereby, the magnetic domains and magnetic domain walls may be moved by a unit bit in a predetermined direction.

When the operations of FIG. 11 and FIG. 12 are alternately and repeatedly performed, the magnetic domains D disposed one side of the first unit 200, for example, left of the first unit 200, are moved to the other side of the first unit 200, for example, to the right of the first unit 200, and predetermined information can be recorded to the magnetic domains D.

<Read Operation>

Figure 13:
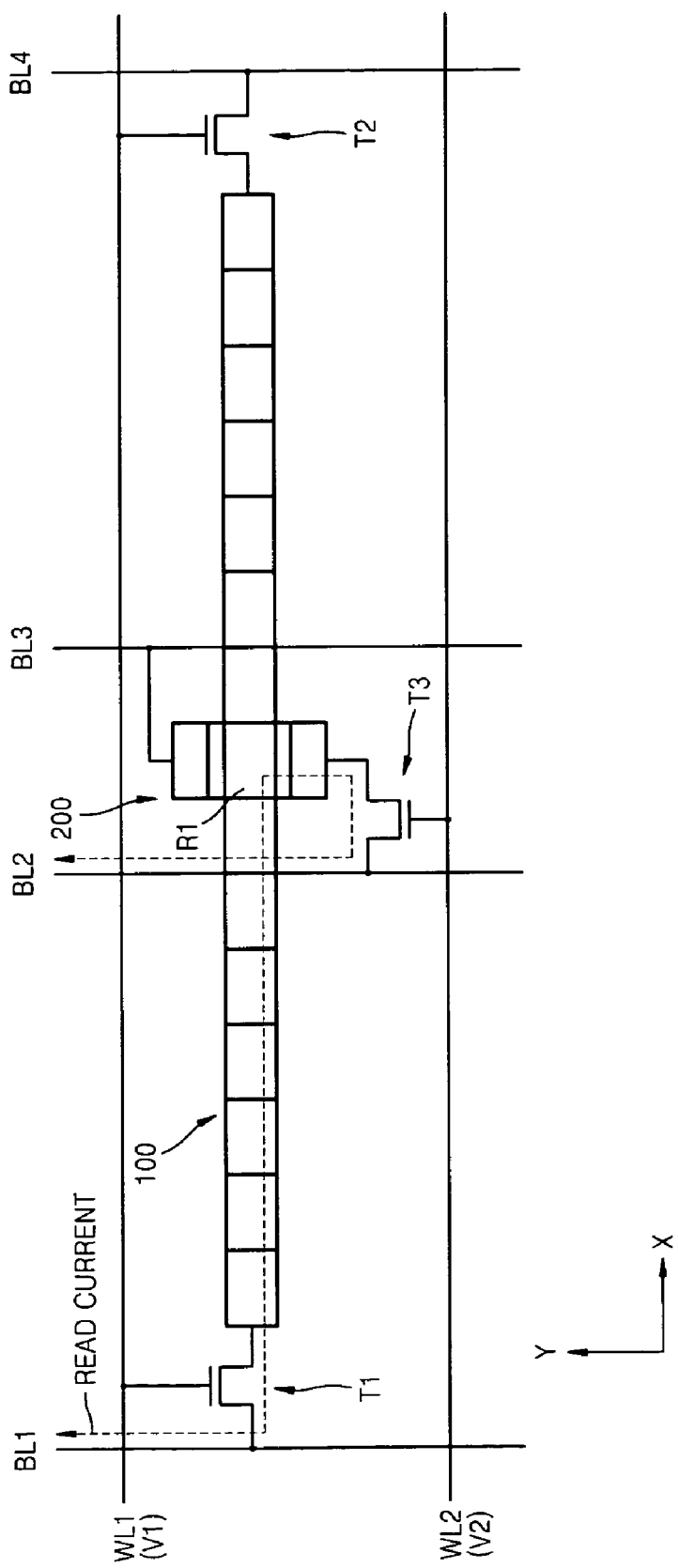

Referring to FIG. 13, while the gates of the first through third transistors T1 through T3 are open by applying predetermined voltages V1 and V2 to the first and second word lines WL1 and WL2, a predetermined read current can be applied between the first bit line BL1 and the second bit line BL2. The read current may flow via a portion of the first unit 200 (for example, a lower portion of the first region R1) and the first region R1 and the intensity of the read current may be significantly affected by the magnetization direction of the first region R1. That is, according to the magnetization direction of the first region R1, an electric resistance between the first bit line BL1 and the second bit line BL2 may significantly vary. Therefore, the recorded information can be read by application of the read current. The intensity of the read current is relatively smaller than that of the write current so that a magnetization state of the first region R1 does not change. Instead of applying a predetermined read current between the first bit line BL1 and the second bit line BL2, a predetermined read current may be applied between the second bit line BL2 and the fourth bit line BL4, thereby performing a read operation. In addition, when the third transistor T3 is disposed at the intersection of the second word line WL2 and the third bit line BL3, instead of the intersection of the second word line WL2 and the second bit line BL2, the read current may be applied to between the third bit line BL3 and the first bit line BL1 or between the third bit line BL3 and the fourth bit line BL4 and thus, information may be reproduced. Accordingly, according to the current embodiment, the read current is applied to between any one of both ends of the first unit 200 and any one of the both ends of the magnetic layer 100 and thus information recorded to the first region R1 can be reproduced. Thus, in the current embodiment of the present invention, at least some portion of the first unit 200 may be used as a device for reproducing information. Therefore, the first unit 200 may be denoted as a read/write unit having both a write function and a read function. However, the first unit 200 may be only used as a write unit and a read unit may be separately installed. In this case, the read unit may be a TMR sensor, a GMR senor, or another type of sensor.

The information reading operation as in FIG. 13 and moving the magnetic domains and the magnetic domain walls in units of bits as in FIG. 12 can be alternately and repeatedly performed. Accordingly, the magnetic domains D disposed on one side of the first unit 200, for example, left of the first unit 200, are moved to the other side of the first unit 200, for example, to the right of the first unit 200, and information recorded to the magnetic domains D can be reproduced.

Figure 14:
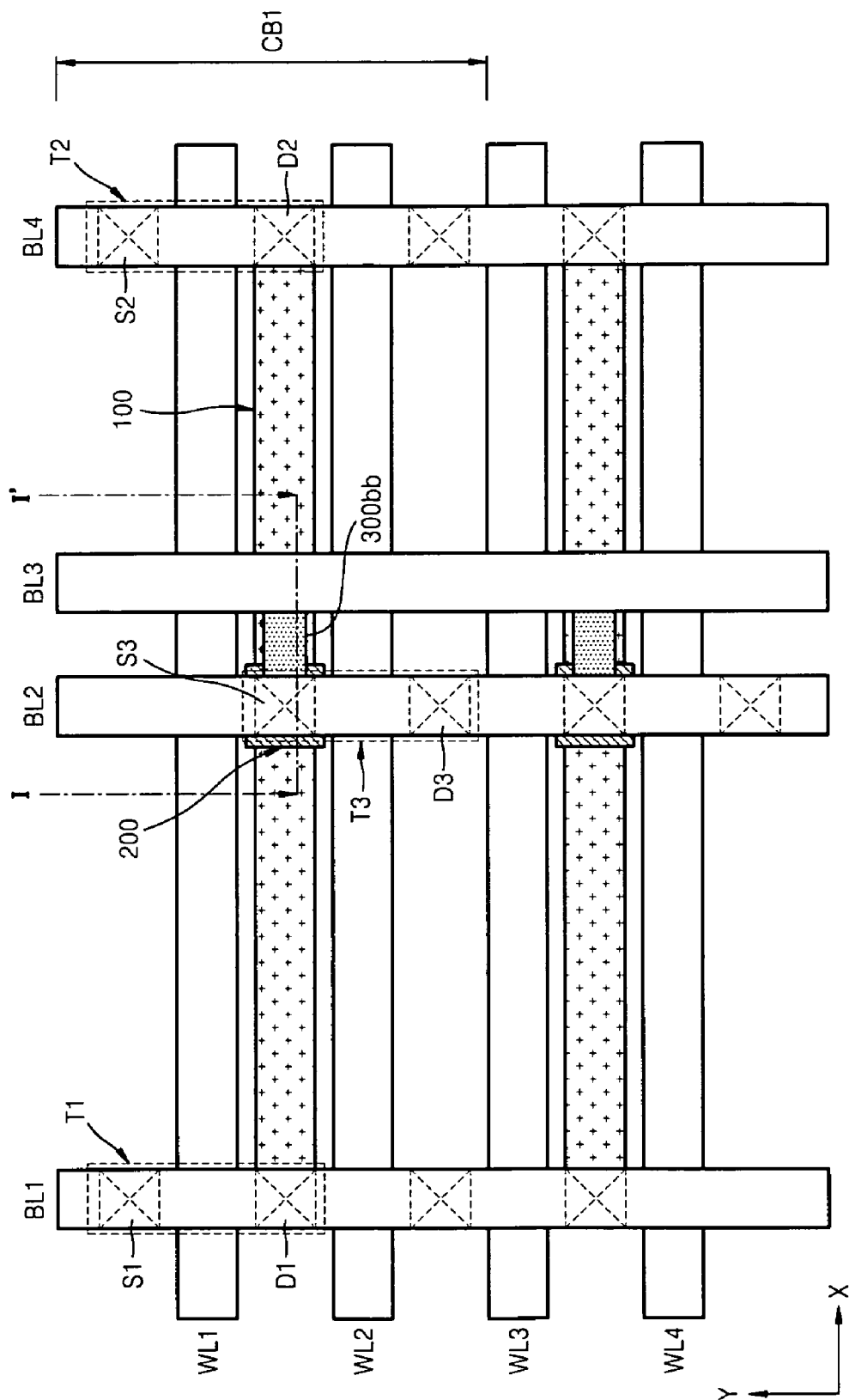
FIG. 14 is a layout view of an information storage device according to an embodiment of the present invention.
Figure 16:
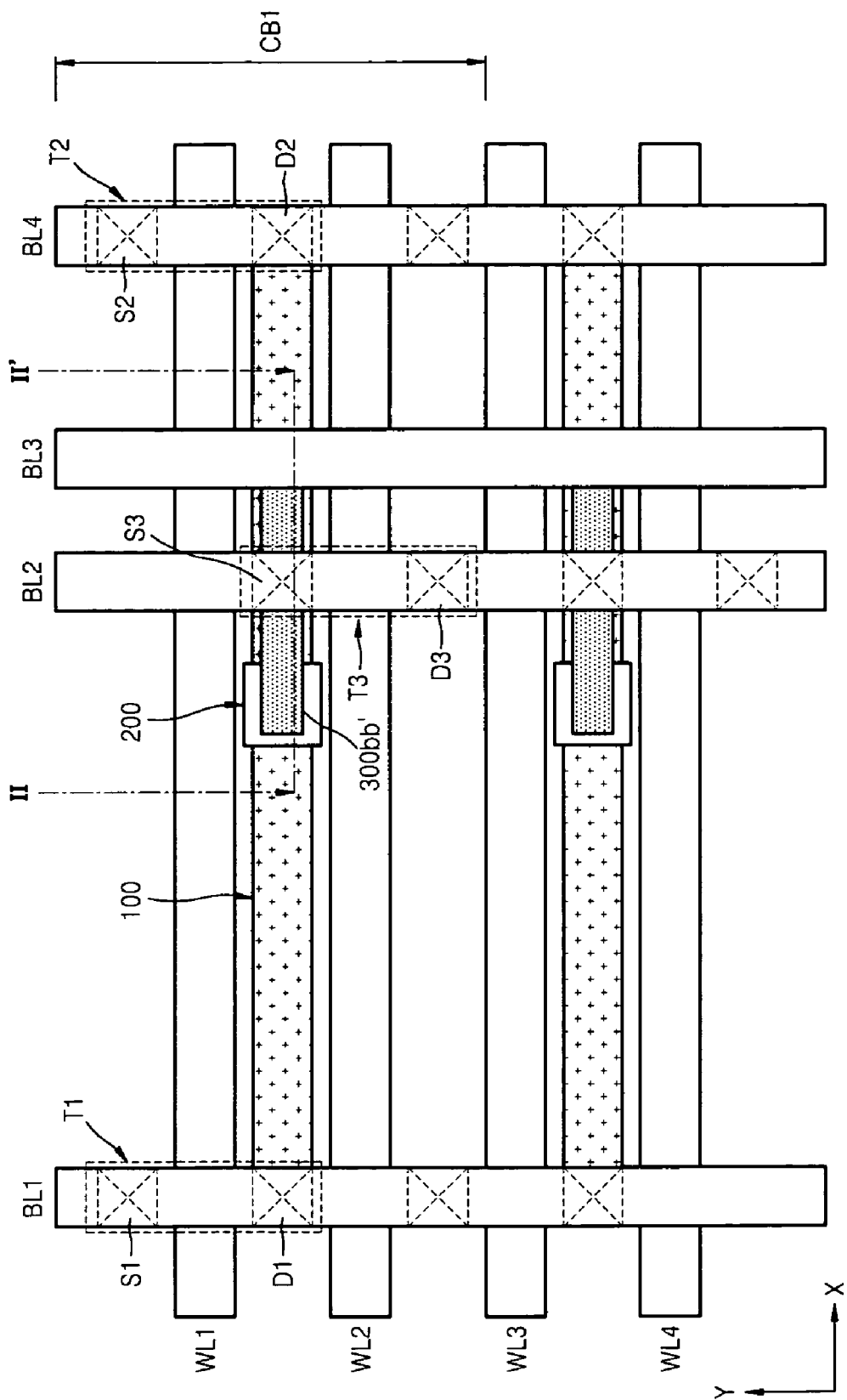
FIG. 16 is a layout view of an information storage device according to another embodiment of the present invention.

The information storage device according to another embodiment of the present invention may include a plurality of the unit memory regions illustrated in FIG. 10 and examples with regard to this are illustrated in FIGS. 14 and 16.

FIG. 14 is a layout view of the information storage device according to an embodiment of the present invention.

Referring to FIG. 14, illustrated are first through fourth word lines WL1 through WL4 and the first through fourth bit lines BL1 through BL4 crossing the first through fourth word lines WL1 through WL4.

The first transistor T1 is disposed near to the intersection of the first word line WL1 and the first bit line BL1 and the second transistor T2 is disposed near to the intersection of the first word line WL1 and the fourth bit line BL4. The first transistor T1 includes a first source S1 and a first drain D1 at both sides of the first word line WL1 and the second transistor T2 includes a second source S2 and a second drain D2 at both sides of the first word line WL1. The magnetic layer 100 in which one end and other end thereof are respectively connected to the first and second transistors T1 and T2 may be provided between the first and second transistors T1 and T2. The first source S1 and the first drain D1 of the first transistor T1 are respectively connected to the first bit line BL1 and one end of the magnetic layer 100 and the second source S2 and the second drain D2 of the second transistor T2 are respectively connected to the fourth bit line BL4 and the other end of the magnetic layer 100. The first unit 200 may be disposed on a predetermined region of the magnetic layer 100, for example, the center portion of the magnetic layer 100 (hereinafter, referred to as the first region R1). The second bit line BL2 may pass over the first unit 200. The third bit line BL3 may be disposed in such a manner as to be spaced apart from the second bit line BL2 by a predetermined interval. The upper surface of the first unit 200 may be electrically connected to the third bit line BL3 by the second conducting wire 300bb. The connection between the upper surface of the first unit 200 and the third bit line BL3 and the connection between the lower surface of the first unit 200 and a third source S3 will be described more fully with reference to FIG. 15. The third transistor T3 is disposed near to the intersection of the second word line WL2 and the second bit line BL2. The third transistor T3 respectively includes the third source S3 and a third drain D3 at both sides of the second word lines WL2. The third source S3 is electrically connected to the lower surface of the first unit 200 and the third drain D3 is electrically connected to the second bit line BL2. In the first through third transistors T1 through T3, functions of the first through third sources S1 through S3 and the first through third drains D1 through D3 may be switched around.

The configuration of the unit memory region CB1 in FIG. 14 may correspond to the unit memory region illustrated in FIG. 10. In FIG. 14, the unit memory region CB1 is repeatedly arranged in a Y-axis direction. However, a plurality of the unit memory regions CB1 may be arranged to configure a plurality of columns and lines in X-axis and Y-axis directions.

Figure 15:
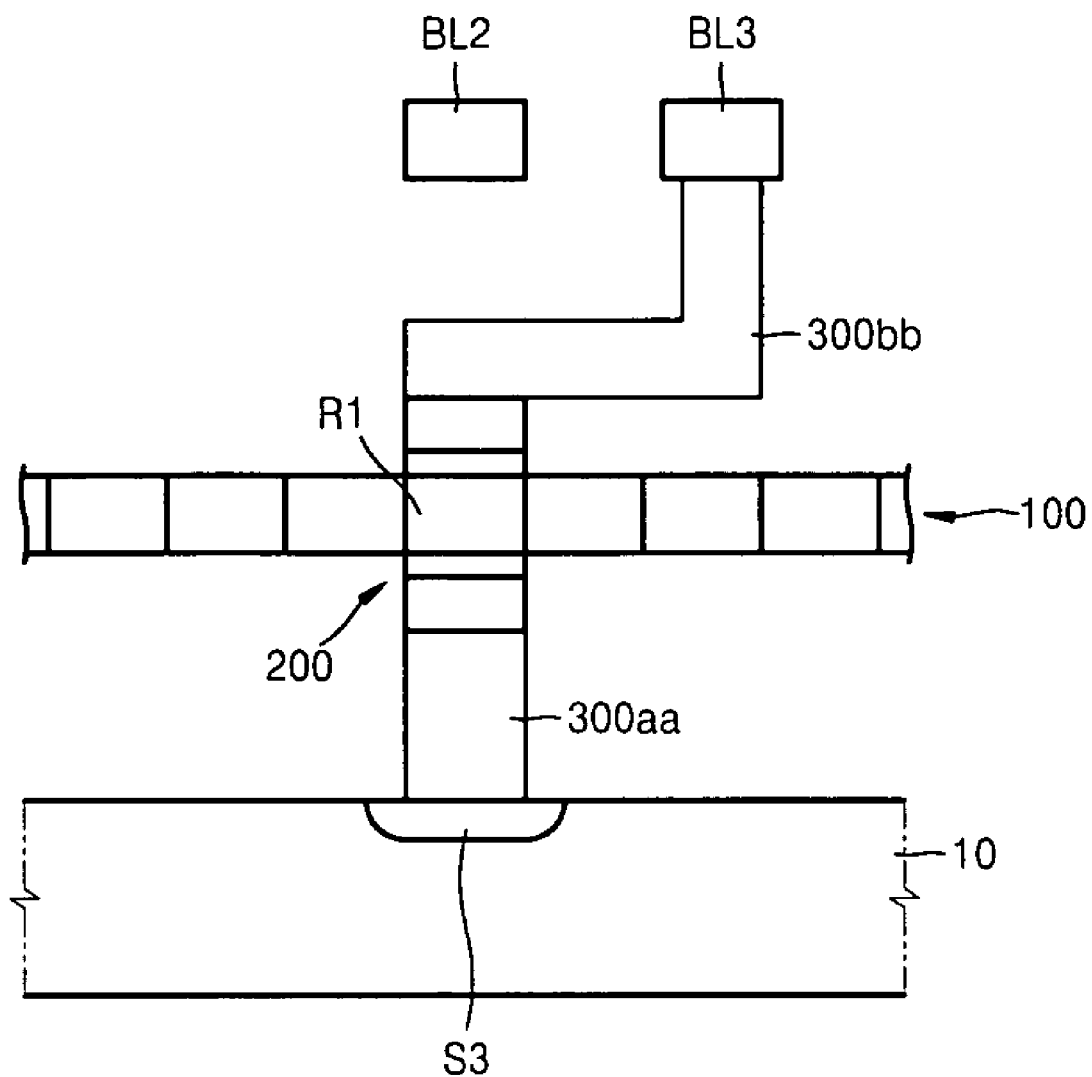
FIG. 15 is a cross-sectional view of the information storage device of FIG. 14 taken along the line I-I' of FIG. 14.

FIG. 15 is a cross-sectional view of the information storage device of FIG. 14 taken along the line I-I' of FIG. 14.

Referring to FIG. 15, the lower surface of the first unit 200 is connected to the third source S3 by the first conducting wire 300aa and the upper surface of the first unit 200 is connected to the third bit line BL3 by the second conducting wire 300bb. The configuration of the second conducting wire 300bb is similar to that of the second conducting wire 300b in FIG. 1. Thus, information can be recorded by the magnetic field generated in the second conducting wire 300bb and the spin transfer torque of the first unit 200. In FIG. 15, a substrate 10 is illustrated and the third source S3 is disposed within the substrate 10, which is also the case in FIG. 17.

FIG. 16 is a layout view of an information storage device according to another embodiment of the present invention. In the current embodiment, the information storage device is transformed from that of FIG. 14. Thus, a repeated description will be omitted and only a portion that is different will be described.

Referring to FIG. 16, the second and third bit lines BL2 and BL3 are moved more right, compared with those illustrated in FIG. 14. That is, the second and third bit lines BL2 and BL3 are disposed in such a manner as to be spaced apart from the first unit 200 in a predetermined interval at one side of the first unit 200, for example, right of the first unit 200. The upper surface of the first unit 200 may be electrically connected to the third bit line BL3 by the second conducting wire 300bb'. The connection between the first unit 200, the third bit line BL3, and the third source S3 is described more fully with reference to FIG. 17.

Figure 17:
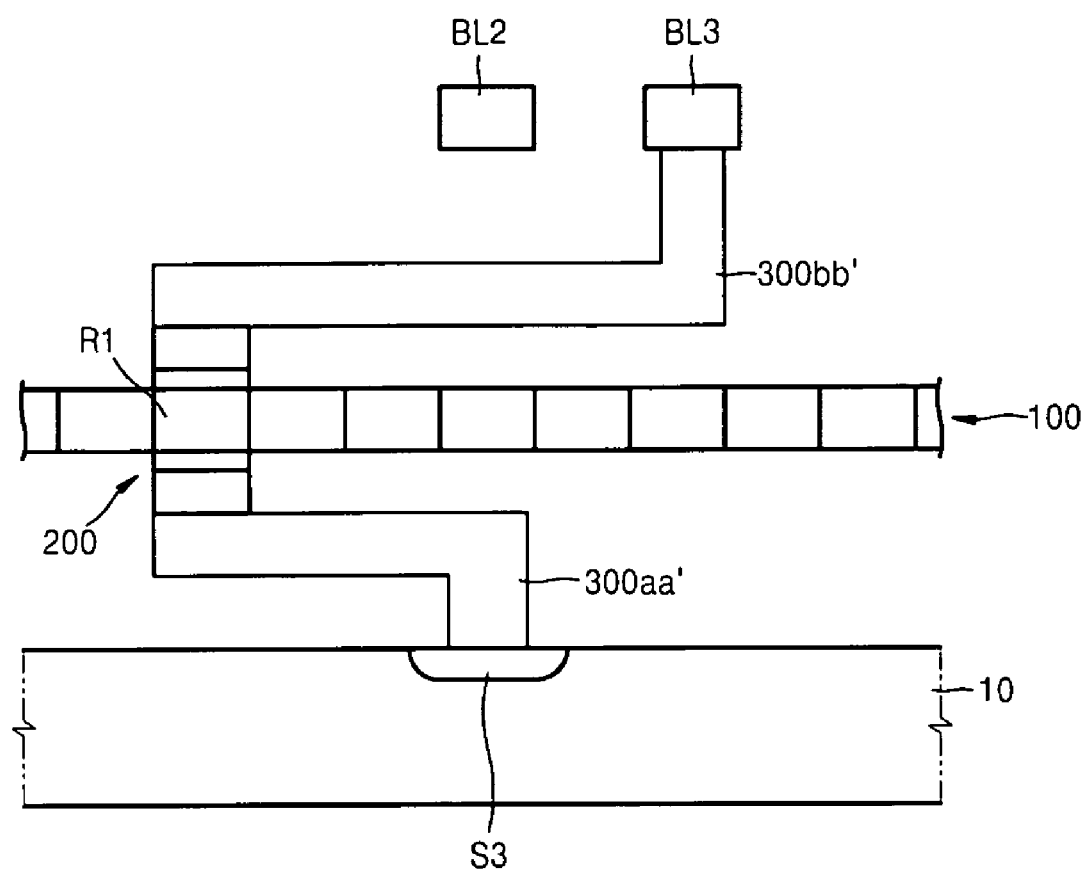
FIG. 17 is a cross-sectional view of the information storage device of FIG. 16 taken along the line II-II' of FIG. 16.

FIG. 17 is a cross-sectional view of the information storage device of FIG. 16 taken along the line II-II' of FIG. 16.

Referring to FIG. 17, the lower surface of the first unit 200 is connected to the third source S3 by the first conducting wire 300aa' and the upper surface of the first unit 200 is connected to the third bit line BL3 by the second conducting wire 300bb'. The configurations of the first conducting wire 300aa' and the second conducting wire 300bb' may be respectively similar to those of the first conducting wire 300a and the second conducting wire 300b in FIG. 1. Thus, information can be recorded by the magnetic field generated in the first conducting wire 300aa' and the second conducting wire 300bb' and the spin transfer torque of the first unit 200.

The connection between the first unit 200, the third bit line BL3, and the third source S3 illustrated in FIGS. 14 through 17 is only an example. That is, the form of the first conducting wires 300aa and 300aa' and the second conducting wires 300bb and 300bb' are only an example. When the layout of the device is changed, the first conducting wires 300aa and 300aa' and/or the second conducting wires 300bb and 300bb' may be similar to the first conducting wire 300a' and/or the second conducting wire 300b' or may have a structure that is modified from the first conducting wire 300a' and/or the second conducting wire 300b'.

While the example embodiments have been described in the detailed description above, it will be understood that the embodiments may be preferred examples, rather than limitations of scope of the embodiments. For example, it would have been obvious to one of ordinary skill in the art to vary structures illustrated in FIGS. 1-3, 8, 10, and 14-17 and to vary the method of operating illustrated in FIGS. 11-13. In addition, it would have been obvious to one of ordinary skill in the art to apply an idea of the example embodiments not only to an information storage device using movement of the magnetic domain walls but also to other information storage devices. Therefore, the scope of the example embodiments will be determined by technical ideas defined in the following claims, instead of preferred examples described in the detailed description above.

What is claimed is:

1. An information storage device comprising:
   a magnetic layer having a plurality of magnetic domain regions and a magnetic domain wall interposed between the magnetic domain regions;
   a first unit disposed on a first of the plurality of magnetic domain regions, the first unit being configured to record information to the first region; and
   a second unit connected to the first unit, the second unit being configured to induce a magnetic field to support the recording of information to the first region.

2. The device of claim 1, wherein through the second unit, a current is applied to the first unit and the magnetic field is generated by the current flowing through the second unit.

3. The device of claim 1, wherein the first unit records information by using a spin transfer torque.

4. The device of claim 3, wherein the first unit comprises:
   a first pinned layer disposed on one of a lower surface and an upper surface of the first region; and
   a first separation layer interposed between the first pinned layer and the first region.

5. The device of claim 4, wherein the first unit further comprises:
   a second pinned layer having a magnetization direction opposite to that of the first pinned layer, the second pinned layer being disposed on the other one of the lower surface and the upper surface of the first region; and
   a second separation layer interposed between the second pinned layer and the first region.

6. The device of claim 4, wherein the first unit further comprises:
   an electrode layer disposed on the other one of the lower surface and the upper surface of the first region; and
   a resistive layer having a higher electric resistance than that of the magnetic layer, the resistive layer being interposed between the electrode layer and the first region.

7. The device of claim 1, wherein the second unit comprises at least one conducting wire connected to the first unit.

8. The device of claim 7, wherein the first unit comprises a lower unit and an upper unit respectively disposed on the lower surface and the upper surface of the first region, any one of the lower unit and the upper unit being connected to a first conducting wire and the other one of the lower unit and the upper unit being connected to a second conducting wire, and at least one of the first and second conducting wires being included in the second unit.

9. The device of claim 8, wherein the first conducting wire comprises a first portion extending from the first unit and the first portion of the first conducting wire is disposed on a first plane that is parallel to the magnetic layer.

10. The device of claim 9, wherein the second conducting wire comprises a first portion extending from the first unit and the first portion of the second conducting wire is disposed on a second plane that is parallel to the magnetic layer.

11. The device of claim 10, wherein the first portion of the first conducting wire and the first portion of the second conducting wire extend in a same direction.

12. The device of claim 9, wherein the first conducting wire further comprises a second portion extending from the first portion and surrounding at least a portion of the first unit on the first plane.

13. The device of claim 11, wherein the first conducting wire further comprises a second portion extending from the first portion of the first conducting wire and surrounding at least a portion of the first unit on the first plane.

14. The device of claim 13, wherein the second conducting wire further comprises a second portion extending from the first portion of the second conducting wire and surrounding at least a portion of the first unit on the second plane.

15. The device of claim 14, wherein the direction in which the second portion of the first conducting wire extends and the direction in which the second portion of the second conducting wire extends are opposite to each other.

16. The device of claim 8, further comprising:
   a first line that is parallel to the magnetic layer;
   second and third lines crossing the first line; and
   a switching device disposed at the intersection of the first wire and the second wire;
   wherein the switching device and the third line are respectively connected to the first conducting wire and the second conducting wire.

17. The device of claim 16, further comprising fourth and fifth lines respectively connected to one end and another end of the magnetic layer.

18. The device of claim 17, further comprising another switching device disposed at least one of between the one end of the magnetic layer and the fourth line and between the other end of the magnetic layer and the fifth line.

19. The device of claim 18, further comprising a sixth line connected to the other switching device which crosses the fourth and fifth lines.

20. The device of claim 1, wherein the first unit further comprises an information reproduction function.

21. The device of claim 1, wherein the first unit is disposed at the center portion of the magnetic layer.

22. The device of claim 8, wherein the magnetic layer, the first unit, the first conducting wire, and the second conducting wire are included in one unit memory region, and the information storage device comprises a plurality of unit memory regions equivalent to the unit memory region.

23. A method of operating the information storage device of claim 1, the method comprising:
   recording information to the first region by applying a write current to the first unit through the second unit.

24. The method of claim 23, further comprising moving magnetic domains and magnetic domain walls in the magnetic layer in units of bits by applying a current to between one end and another end of the magnetic layer.

25. The method of claim 23, further comprising reproducing information recorded in the magnetic layer by applying a read current to between any one of both ends of the magnetic layer and the first unit.

* * * * *